United States Patent
Park et al.

(10) Patent No.: US 12,439,761 B2
(45) Date of Patent: Oct. 7, 2025

(54) DISPLAY DEVICE

(71) Applicant: Samsung Display Co., LTD., Yongin-si (KR)

(72) Inventors: Do Yeong Park, Hwaseong-si (KR); Chong Chul Chai, Seoul (KR); Kyung Bae Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 468 days.

(21) Appl. No.: 18/089,701

(22) Filed: Dec. 28, 2022

(65) Prior Publication Data

US 2023/0207610 A1    Jun. 29, 2023

(30) Foreign Application Priority Data

Dec. 29, 2021   (KR) .......................... 10-2021-0191647

(51) Int. Cl.
*H10H 29/14*   (2025.01)
*H10H 20/821*   (2025.01)
*H10H 20/84*   (2025.01)

(52) U.S. Cl.
CPC ........ *H10H 29/142* (2025.01); *H10H 20/821* (2025.01); *H10H 20/84* (2025.01)

(58) Field of Classification Search
None
See application file for complete search history.

(56) References Cited

U.S. PATENT DOCUMENTS

| | | | |
|---|---|---|---|
| 2013/0027623 A1 | 1/2013 | Negishi et al. | |
| 2019/0244985 A1* | 8/2019 | Kim | H10H 20/8316 |
| 2020/0273397 A1* | 8/2020 | Jeong | G09G 3/32 |
| 2021/0320237 A1* | 10/2021 | Kim | H01L 25/167 |
| 2021/0366888 A1* | 11/2021 | Kim | H01L 25/0753 |

FOREIGN PATENT DOCUMENTS

| | | |
|---|---|---|
| JP | 2020-008751 | 1/2020 |
| KR | 10-2017-0141305 | 12/2017 |
| KR | 10-2018-0009014 | 1/2018 |
| KR | 10-2018-0011404 | 2/2018 |
| KR | 10-2020-0098767 | 8/2020 |
| KR | 2021-0132259 | 11/2021 |
| KR | 2021-0132260 | 11/2021 |
| WO | 2021-118081 | 6/2021 |

* cited by examiner

*Primary Examiner* — Bilkis Jahan
(74) *Attorney, Agent, or Firm* — Womble Bond Dickinson (US) LLP

(57) ABSTRACT

A display device includes a first electrode extending in a first direction, a second electrode spaced apart from the first electrode in a second direction, light emitting elements that are disposed on the first electrode and the second electrode, a first connection electrode electrically connected to a first end of the light emitting elements, and a second connection electrode electrically connected to a second end of the light emitting elements. The first connection electrode includes a first main portion disposed on the first electrode and in electrical contact with the light emitting elements, a first bypass portion partially spaced apart from the first main portion, and first connection portions electrically connecting the first main portion to the first bypass portion.

20 Claims, 27 Drawing Sheets

DISPLAY DEVICE

CROSS-REFERENCE TO RELATED APPLICATION(S)

This application claims priority to and benefits of Korean Patent Application No. 10-2021-0191647 under 35 U.S.C. § 119, filed on Dec. 29, 2021 in the Korean Intellectual Property Office (KIPO), the entire contents of which are herein incorporated by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. A self-light emitting display device may include an organic light emitting display device using an organic material as a light emitting material as a light emitting element, an inorganic light emitting display device using an inorganic material as a light emitting material, or the like.

SUMMARY

Aspects of the disclosure provide a display device that includes a novel electrode structure to prevent occurrence of dark spots in a pixel.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a first electrode extending in a first direction, a second electrode spaced apart from the first electrode in a second direction, light emitting elements that are disposed on the first electrode and the second electrode, a first connection electrode electrically connected to a first end of the light emitting elements, and a second connection electrode electrically connected to a second end of the light emitting elements. The first connection electrode may include a first main portion disposed on the first electrode and in electrical contact with the light emitting elements, a first bypass portion partially spaced apart from the first main portion, and first connection portions electrically connecting the first main portion to the first bypass portion.

The display device may further include a bank layer extending in the first direction and the second direction to surround an emission area including the light emitting elements. The first bypass portion may be disposed on the bank layer.

The second connection electrode may include a second main portion disposed on the second electrode and in electrical contact with the light emitting elements, a second bypass portion partially spaced apart from the second main portion and disposed on the bank layer, and second connection portions electrically connecting the second main portion to the second bypass portion. The first bypass portion may do not overlap the first electrode and the second bypass portion does not overlap the second electrode.

Each of the first main portion and the second main portion may extend in the first direction, and each of the first bypass portion and the second bypass portion may extend in the first direction.

The first main portion and the second main portion may be partially disposed on the bank layer, and each of the first connection portion and the second connection portion may be disposed on the bank layer.

Each of the first bypass portion and the second bypass portion may be disposed to partially overlap the emission area.

Each of the first and second bypass portions and the first and second connection portions may do not overlap the light emitting elements.

The display device may further include a sub-region spaced apart from the emission area in the first direction. The first main portion and the second main portion may extend to the sub-region, the first connection electrode may further include a first contact portion disposed in the sub-region and electrically connected to the first electrode, and the second connection electrode may further include a second contact portion disposed in the sub-region and electrically connected to the second electrode.

The first main portion, the first connection portions, and the first bypass portion may be electrically connected to the first contact portion, and the second main portion, the second connection portions, and the second bypass portion may be electrically connected to the second contact portion.

The first connection electrode may further include a third connection portion spaced apart from the first connection portion and electrically connected to the first main portion and the first bypass portion.

The display device may further include a first bank pattern extending in the first direction and overlapping the first electrode, and a second bank pattern extending in the second direction and overlapping the second electrode. The first bank pattern may overlap the first main portion without overlapping the first bypass portion, and the second bank pattern may overlap the second main portion without overlapping the second bypass portion.

The display device may further include a third electrode spaced apart from the first electrode in the second direction with the second electrode interposed therebetween. The light emitting elements may include a first light emitting element disposed on the second electrode and the third electrode, and a second light emitting element disposed on the first electrode and the second electrode, the first connection electrode may be electrically connected to a second end of the second light emitting element, and the second connection electrode may be electrically connected to a first end of the first light emitting element.

The display device may further include a third main portion disposed on the third electrode and in electrical contact with a second end of the first light emitting element, a fourth main portion disposed to be spaced apart from the first main portion on the second electrode and in electrical contact with a first end of the second light emitting element, a second bypass portion partially spaced apart from the third main portion, a second connection portion electrically connected to the third main portion, the fourth main portion, and the second bypass portion, and a third connection electrode including a third connection portion electrically connected to the third main portion and the second bypass portion.

Each of the second connection portion, the third connection portion, and the second bypass portion may be disposed on the bank layer.

The first connection electrode may further include a first contact portion in electrical contact with the first electrode, and the second connection electrode may further include a second contact portion in electrical contact with the second electrode.

According to an embodiment of the disclosure, a display device may include electrodes extending in a first direction and spaced apart from each other in a second direction, the electrodes including a first electrode, a second electrode spaced apart from the first electrode in the second direction, a third electrode disposed between the first electrode and the second electrode, and a fourth electrode spaced apart from the third electrode in the second direction with the second electrode interposed therebetween. The display device may include light emitting elements disposed on the electrodes spaced apart from each other in the second direction, a bank layer extending in the first and second directions and surrounding an emission area in which light the emitting elements may be disposed, and connection electrodes disposed on at least one of the electrodes and including a main portion in contact with the light emitting elements. The connection electrodes may include a first connection electrode including a first main portion disposed on the first electrode, a second connection electrode including a second main portion disposed on the second electrode, a third connection electrode including a third main portion disposed on the third electrode and facing the first main portion, and a fourth main portion disposed on the first electrode and spaced apart from the first main portion in the first direction, a fourth connection electrode including a fifth main portion disposed on the fourth electrode and facing the second main portion, and a sixth main portion disposed on the second electrode and spaced apart from the second main portion in the first direction, and a fifth connection electrode including a seventh main portion disposed on the second electrode and spaced apart from the second main portion in the first direction, and an eighth main portion disposed on the third electrode and spaced apart from the third main portion in the first direction. The first connection electrode may include a first bypass portion disposed on the bank layer to be partially spaced apart from the first main portion, a first connection portion disposed on the bank layer to electrically connect the first bypass portion to the first main portion, and a second connection portion partially disposed in the emission area and electrically connecting the first bypass portion to the first main portion.

The third connection electrode may further include a third bypass portion disposed on the bank layer to be partially spaced apart from the fourth main portion, the third main portion partially disposed in the emission area, a third connection portion electrically connecting the fourth main portion to the third bypass portion, and a fourth connection portion disposed on the bank layer and electrically connecting the fourth main portion to the third bypass portion. The fourth connection electrode may further include a fourth bypass portion disposed on the bank layer to be partially spaced apart from the fifth main portion, the fifth main portion partially disposed in the emission area, a fifth connection portion electrically connecting the sixth main portion to the fourth bypass portion, and a sixth connection portion disposed on the bank layer and electrically connecting the fifth main portion to the fourth bypass portion.

The fifth connection electrode may further include a fifth bypass portion disposed on the bank layer to be partially spaced apart from the eighth main portion, the seventh main portion disposed on the bank layer, a seventh connection portion electrically connecting the eighth main portion to the fifth bypass portion, and an eighth connection portion partially disposed in the emission area and electrically connecting the eighth main portion to the fifth bypass portion.

The display device may further include a sub-region disposed in the first direction of the emission area. The first connection electrode may further include a first contact portion electrically connected to the first main portion and in contact with the first electrode in the sub-region, and the second connection electrode may further include a second contact portion electrically connected to the second main portion and in electrical contact with the second electrode in the sub-region.

The light emitting elements may include a first light emitting element disposed on the first electrode and the third electrode and having a first end in electrical contact with the first main portion and a second end in electrical contact with the third main portion, a second light emitting element disposed on the second electrode and the fourth electrode and having a first end in electrical contact with the fifth main portion and a second end in electrical contact with the second main portion, a third light emitting element disposed on the first electrode and the third electrode and having a first end in electrical contact with the fourth main portion and a second end in electrical contact with the seventh main portion, and a fourth light emitting element disposed on the second electrode and the fourth electrode and having a first end in electrical contact with the eighth main portion and a second end in electrical contact with the sixth main portion.

In the display device according to an embodiment, connection electrodes may include a portion disposed on a path where a light emitting element may be disposed and a portion disposed on a bank layer. The electrical connection of the connection electrodes may be maintained by the portion disposed on the bank layer even if disconnection occurs at the portion disposed on the path due to aggregation of light emitting elements. In the display device according to an embodiment, it may be possible to prevent the occurrence of dark spots in the corresponding pixel even if a part of the connection electrode may be disconnected due to the aggregation of light emitting elements.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
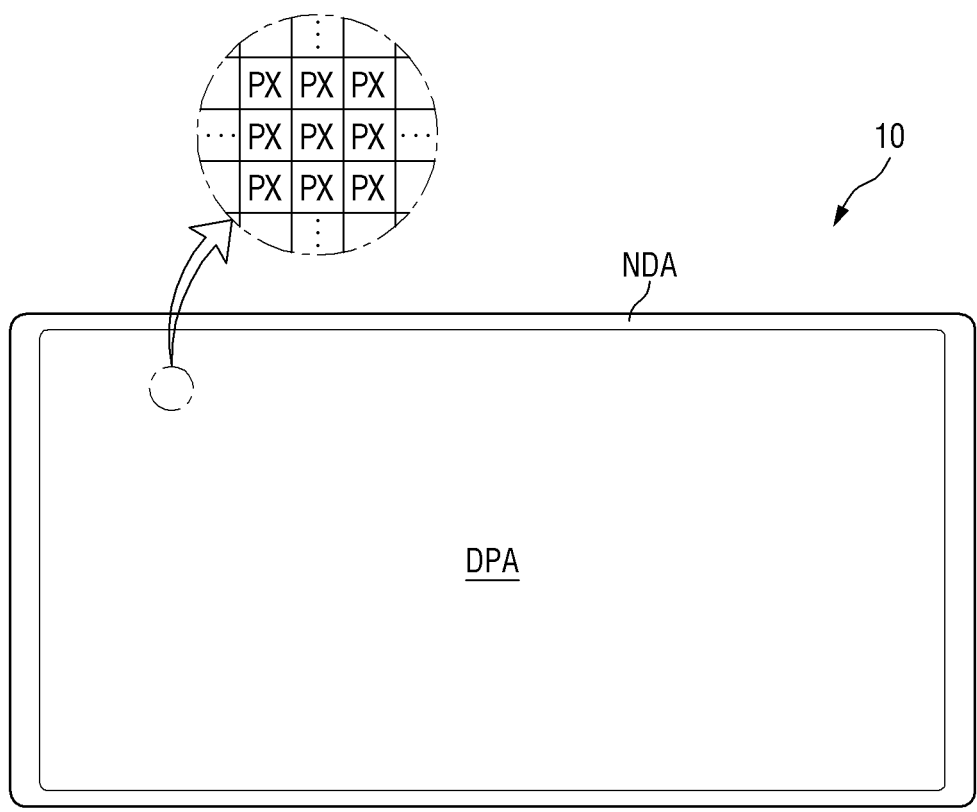
FIG. 1 is a schematic plan view of a display device according to an embodiment.
Figure 1:
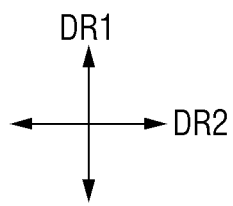

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be disclosed, but the disclosure is not limited thereto, and other display panels may be applied.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to a direction. The pixels PX may be arranged in a stripe type or an island type. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
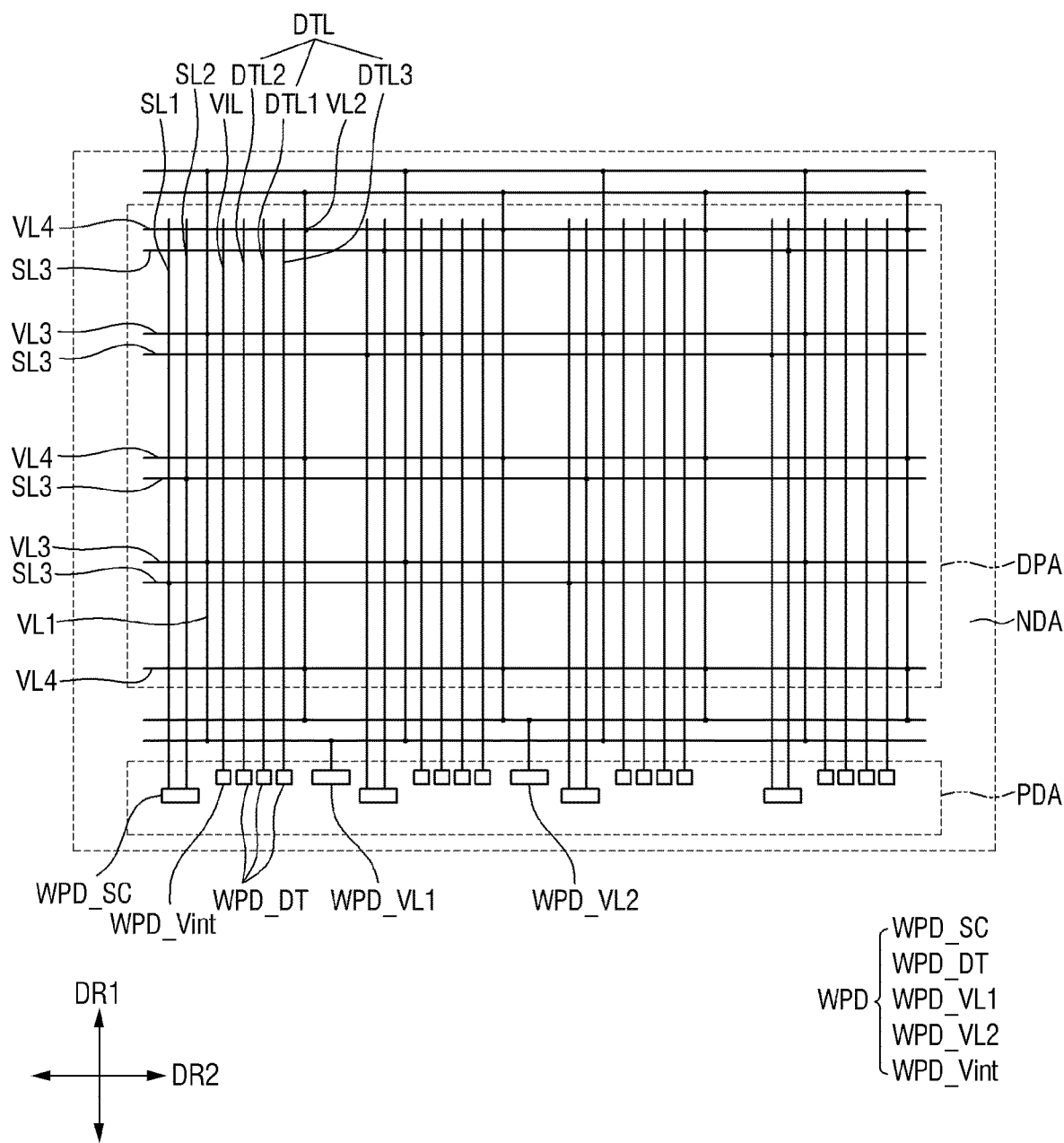
FIG. 2 is a schematic plan view illustrating an arrangement of wires included in a display device according to an embodiment.

FIG. 2 is a schematic plan view illustrating an arrangement of wires included in a display device according to an embodiment.

Referring to FIG. 2, the display device 10 may include wires. The display device 10 may include scan lines SL1, SL2, and SL3, data lines DTL (DTL1, DTL2, and DTL3), an initialization voltage line VIL, and voltage lines VL (VL1, VL2, VL3, and VL4). Although not shown in the drawing, other wires may be further provided in the display device 10.

The first scan line SL1 and the second scan line SL2 may be disposed to extend in the first direction DR1. The first scan line SL1 and the second scan line SL2 may be disposed adjacent to each other, and may be disposed to be spaced apart from the different first scan line SL1 and second scan line SL2 in the second direction DR2. The first scan line SL1 and the second scan line SL2 may be connected to a scan line pad WPD_SC connected to a scan driver (not illustrated). The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced apart from another third scan line SL3 in the first direction DR1. One third scan line SL3 may be connected to one or more first scan lines SL1 or one or more second scan lines SL2. In an embodiment, the first scan line SL1 and the second scan line SL2 may be formed as a conductive layer disposed on a different layer from the third scan line SL3. The scan lines SL1, SL2, and SL3 may have a mesh structure in the entire surface of the display area DPA, but are not limited thereto.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween. It will be understood that the terms "connected to" or "coupled to" may include a physical or electrical connection or coupling.

The data lines DTL may be disposed to extend in the first direction DR1. The data line DTL may include a first data line DTL1, a second data line DTL2, and a third data line DTL3, and each one of the first to third data lines DTL1, DTL2, and DTL3 may form a pair and may be disposed adjacent to each other. Each of the data lines DTL1, DTL2, and DTL3 may be disposed to extend from the pad area PDA disposed in the non-display area NDA to the display area DPA. However, the disclosure is not limited thereto, and the data lines DTL may be spaced apart from each other at equal intervals between a first voltage line VL1 and a second voltage line VL2 to be described later.

The initialization voltage line VIL may be disposed to extend in the first direction DR1. The initialization voltage line VIL may be disposed between the data lines DTL and the first scan line SL1 and the second scan line SL2. The initialization voltage line VIL may be disposed to extend from the pad area PDA disposed in the non-display area NDA to the display area DPA.

The first voltage line VL1 and the second voltage line VL2 may be disposed to extend in the first direction DR1, and the third voltage line VL3 and the fourth voltage line VL4 may be disposed to extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to extend in the first direction DR1 to cross the display area DPA, and as for the third voltage line VL3 and the fourth voltage line VL4, some of the wires may be disposed in the display area DPA and other wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, the second voltage line VL2 may be connected to at least one fourth voltage line VL4, and the voltage lines VL may have a mesh structure in the entire display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each of the line pads WPD may be disposed in the pad area PDA positioned on the lower side, which may be another side of the display area DPA in the first direction DR1. The first scan line SL1 and the second scan line SL2 may be connected to the scan line pad WPD_SC disposed in the pad area PDA, and the data lines DTL may be connected to the data line pads WPD_DT different from each other, respectively. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. The external devices may be mounted on the line pads WPD. The external devices may be mounted on the line pads WPD by applying an anisotropic conductive film, ultrasonic bonding or the like. The drawing discloses that each of the line pads WPD may be disposed on the pad area PDA disposed on the lower side of the display area DPA, but are not limited thereto. Some of the line pads WPD may be disposed in at least one area on the upper side or on the left and right sides of the display area DPA.

Each pixel PX or sub-pixel SPXn (n may be an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
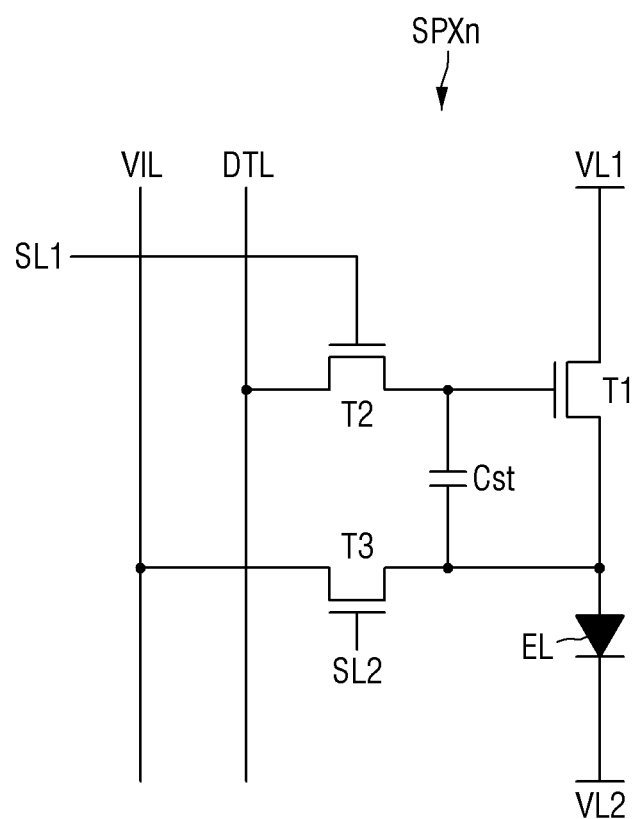
FIG. 3 is a schematic diagram of an equivalent circuit of a sub-pixel of a display device according to an embodiment.

FIG. 3 is a schematic diagram of an equivalent circuit of a sub-pixel of a display device according to an embodiment.

Referring to FIG. 3, each sub-pixel SPXn of the display device 10 according to an embodiment may include three transistors T1, T2 and T3 and a storage capacitor Cst in addition to a light emitting diode EL.

The light emitting diode EL may emit light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

An end of the light emitting diode EL may be connected to the source electrode of the first transistor T1, and another end thereof may be connected to the second voltage line VL2 to which a low potential voltage (hereinafter, a second power voltage) lower than a high potential voltage (hereinafter, a first power voltage) of the first voltage line VL1 may be supplied.

The first transistor T1 may adjust a current flowing from the first voltage line VL1, to which the first power voltage may be supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage may be applied.

The second transistor T2 may be turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 may be turned on by a scan signal of the second scan line SL2 to connect the initialization voltage line VIL to an end of the light emitting diode EL. The gate electrode of the third transistor T3 may be connected to the second scan line SL2, the drain electrode thereof may be connected to the initialization voltage line VIL, and the source electrode thereof may be connected to an end of the light emitting diode EL or to the source electrode of the first transistor T1.

In an embodiment, the source electrode and the drain electrode of each of the transistors T1, T2, and T3 are not limited to those described above, and vice versa. Further, each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. In another embodiment, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst stores a difference voltage between a gate voltage and a source voltage of the first transistor T1.

Figure 4:
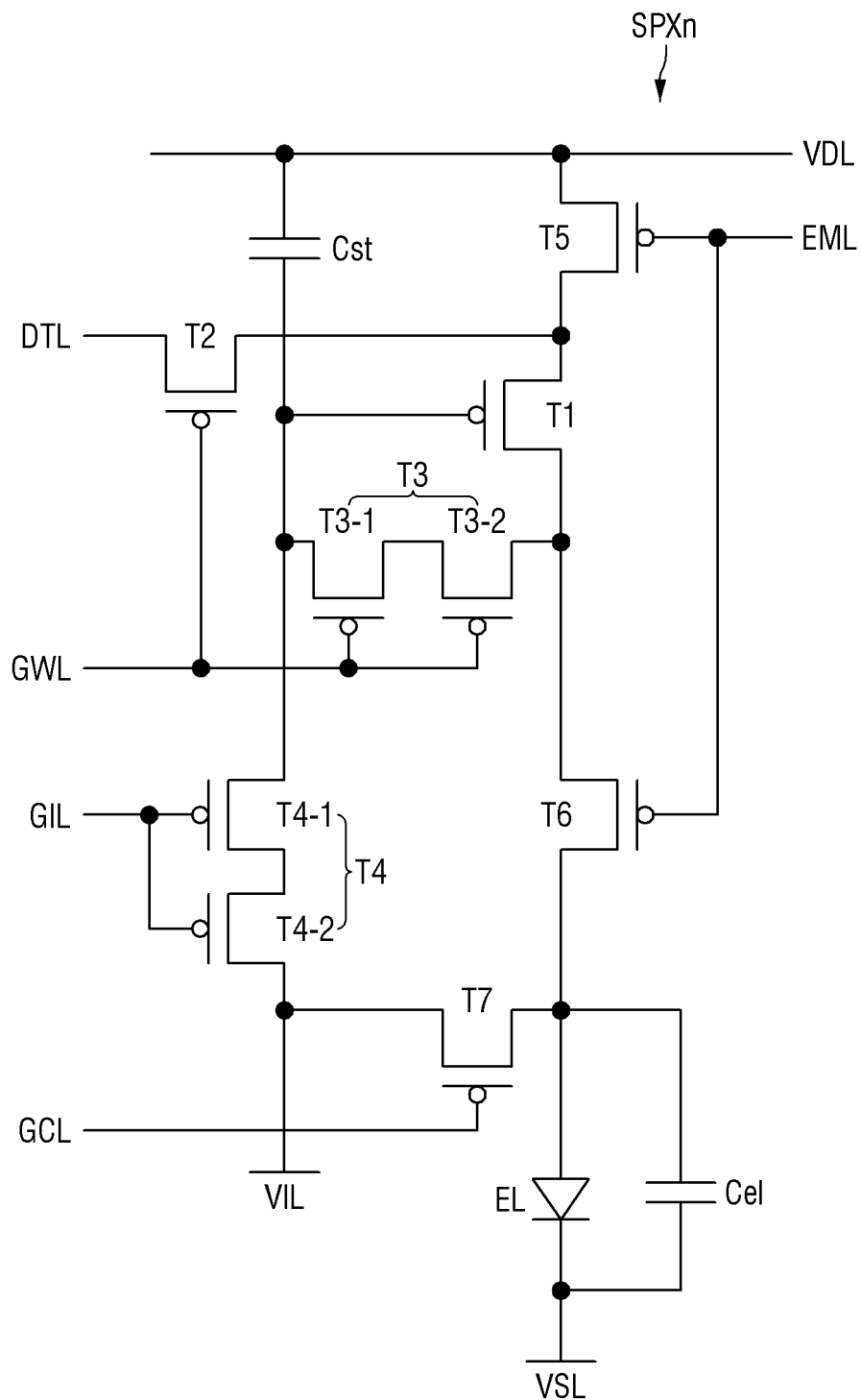
FIG. 4 is a schematic diagram of an equivalent circuit of a sub-pixel of a display device according to another embodiment.

FIG. 4 is a schematic diagram of an equivalent circuit of a sub-pixel of a display device according to another embodiment. FIG. 4 illustrates an embodiment in which a sub-pixel SPXn includes first to seventh transistors T1, T2, T3, T4, T5, T6, and T7 and the first to seventh transistors T1, T2, T3, T4, T5, T6, and T7 may be formed as P-type MOSFETs.

Referring to FIG. 4, the pixel circuit of a sub-pixel SPXn of the display device 10 may include a light emitting diode EL, the first to seventh transistors T1, T2, T3, T4, T5, T6, and T7, and a storage capacitor Cst. The pixel circuit may be connected to the data line DTL, a first scan line GWL, a second scan line GIL, a third scan line GCL, an emission control line EML, a first voltage line VDL, a second voltage line VSL, and the initialization voltage line VIL.

An end of the light emitting diode EL may be connected to the first electrode of the seventh transistor T7 and the second electrode of the sixth transistor T6, and another end thereof may be connected to the second voltage line VSL. A parasitic capacitance Cel may be formed between an end and another end of the light emitting diode EL.

The gate electrode of the first transistor T1 may be connected to the first electrode of the storage capacitor Cst. The first electrode of the first transistor T1 may be connected to the first voltage line VDL via the fifth transistor T5, and the second electrode of the first transistor T1 may be connected to an end of the light emitting diode EL via the sixth transistor T6. The first transistor T1 may receive the signal of the data line DTL in response to the switching operation of the second transistor T2 and supply a driving current to the light emitting diode EL.

The gate electrode of the second transistor T2 may be connected to the first scan line GWL. The first electrode of the second transistor T2 may be connected to the data line DTL, and the second electrode of the second transistor T2 may be connected to the first electrode of the first transistor T1. The second transistor T2 may be turned on by the signal of the first scan line GWL to transmit a data signal to the first electrode of the first transistor T1.

The gate electrode of the third transistor T3 may be connected to the first scan line GWL. The first electrode of the third transistor T3 may be connected to the second electrode of the first transistor T1 and may be connected to an end of the light emitting diode EL via the sixth transistor T6. The second electrode of the third transistor T3 may be connected to the first electrode of the storage capacitor Cst, the first electrode of the fourth transistor T4, and the gate electrode of the first transistor T1. The third transistor T3 may be turned on by the signal of the first scan line GWL to connect the gate electrode and the second electrode of the first transistor T1, thereby diode connecting the first transistor T1. As a consequence, a voltage difference as much as the threshold voltage of the first transistor T1 may occur between the first electrode and the gate electrode of the first transistor T1, and a threshold voltage-compensated data signal may be supplied to the gate electrode of the first transistor T1 to compensate for the threshold voltage deviation of the first transistor T1.

The gate electrode of the fourth transistor T4 may be connected to the second scan line GIL. The second electrode of the fourth transistor T4 may be connected to the initialization voltage line VIL, and the first electrode of the fourth transistor T4 may be connected to the first electrode of the storage capacitor Cst, the second electrode of the second transistor T2, and the gate electrode of the first transistor T1. The fourth transistor T4 may be turned on by the signal of the second scan line GIL to transfer the initialization voltage line VIL to the gate electrode of the first transistor T1 and initialize the voltage of the gate electrode of the first transistor T1.

Each of the third transistor T3 and the fourth transistor T4 may be formed as a dual transistor. The third transistor T3 may include a third-first transistor T3-1 and a third-second transistor T3-2, and the fourth transistor T4 may include a fourth-first transistor T4-1 and a fourth-second transistor T4-2. However, the disclosure is not limited thereto, and each of the third transistor T3 and the fourth transistor T4 may not be formed as a dual transistor.

The gate electrode of the fifth transistor T5 may be connected to the emission control line EML. The first electrode of the fifth transistor T5 may be connected to the first voltage line VDL, and the second electrode of the fifth transistor T5 may be connected to the first electrode of the first transistor T1 and the second electrode of the second transistor T2.

The gate electrode of the sixth transistor T6 may be connected to the emission control line EML. The first electrode of the sixth transistor T6 may be connected to the second electrode of the first transistor T1 and the first electrode of the third transistor T3, and the second electrode of the sixth transistor T6 may be connected to an end of the light emitting diode EL.

The fifth transistor T5 and the sixth transistor T6 may be simultaneously turned on by the signal of the emission control line EML, so that a driving current may flow through the light emitting diode EL.

The gate electrode of the seventh transistor T7 may be connected to the third scan line GCL. The first electrode of the seventh transistor T7 may be connected to an end of the light emitting diode EL, and the second electrode of the seventh transistor T7 may be connected to the initialization voltage line VIL. The seventh transistor T7 may be turned on by the signal of the third scan line GCL to initialize an end of the light emitting diode EL.

Figure 5:
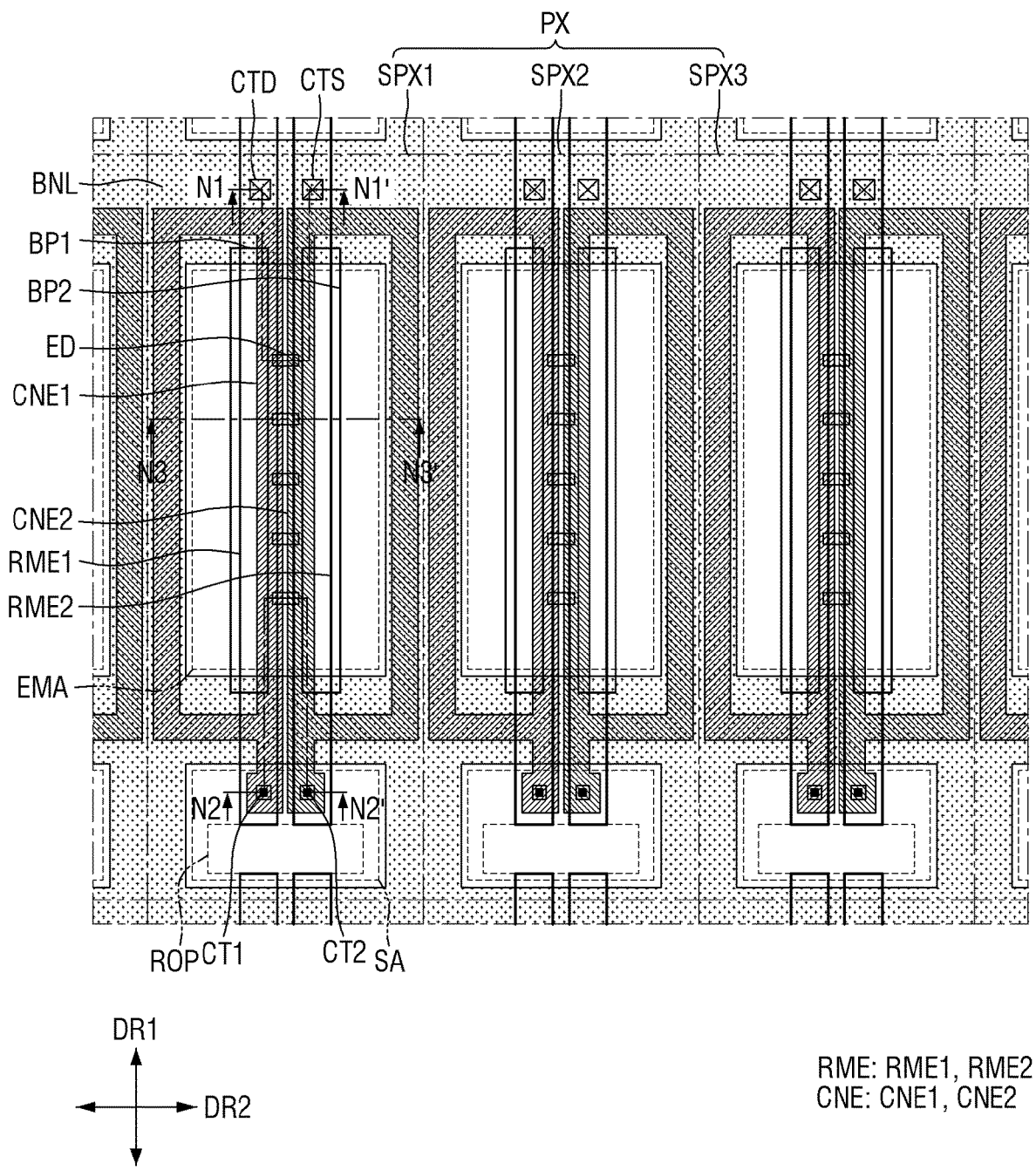
FIG. 5 is a schematic plan view illustrating a pixel of a display device according to an embodiment.

The second electrode of the storage capacitor Cst may be connected to the first voltage line VDL. The first electrode of the storage capacitor Cst may be connected simultaneously to the gate electrode of the first transistor T1, the second electrode of the third transistor T3, and the first electrode of the fourth transistor T4. FIG. 5 is a schematic plan view illustrating a pixel of a display device according to an embodiment. FIG. 5 illustrates planar arrangement of electrodes RME (RME1 and RME2), bank patterns BP1 and BP2, a bank layer BNL, light emitting elements ED, and connection electrodes CNE (CNE1 and CNE2) disposed in a pixel PX of the display device 10.

Referring to FIG. 5, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn or some of the sub-pixels SPXn may emit light of the same color. For example, the sub-pixels SPXn may emit the same blue light, or two sub-pixels SPXn may emit the same blue light, and another sub-pixel SPXn may emit green light different from the blue light. Although it is illustrated in the drawing that a pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED may be disposed to emit light of a specific wavelength band. The non-emission area may be a region in which the light emitting element ED may not be disposed and a region from which light may not be emitted because light emitted from the light emitting element ED does not reach it.

The emission area EMA may include the region in which the light emitting element ED may be disposed, and a region adjacent to the light emitting element ED in which the lights emitted from the light emitting element ED may be emitted. For example, the emission area EMA may further include a region in which the light emitted from the light emitting element ED may be reflected or refracted by another member and emitted. The light emitting elements ED may be disposed in the respective sub-pixels SPXn, and the emission area EMA may be formed to include an area where the light emitting elements 30 may be disposed and an area adjacent thereto.

Although it is shown in the drawing that the sub-pixels SPXn have the emission areas EMA that may be substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which may be another side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from that shown in FIG. 5.

Light may not be emitted from the sub-region SA because the light emitting element ED may not be disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The wires and the circuit elements of the circuit layer may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within a pixel PX.

The bank layer BNL may be disposed to surround the sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the sub-pixels SPXn, the emission areas EMA, and the sub-regions SA may vary depending on the width of the bank layer BNL.

The bank layer BNL may include portions extending in the first direction DR1 and the second direction DR2 in plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to surround the emission area EMA and the sub-region SA disposed for each sub-pixel SPXn to delimit them from each other. Hereinafter, the structure of the display device 10 will be described in detail with reference to other drawings.

Figure 6:
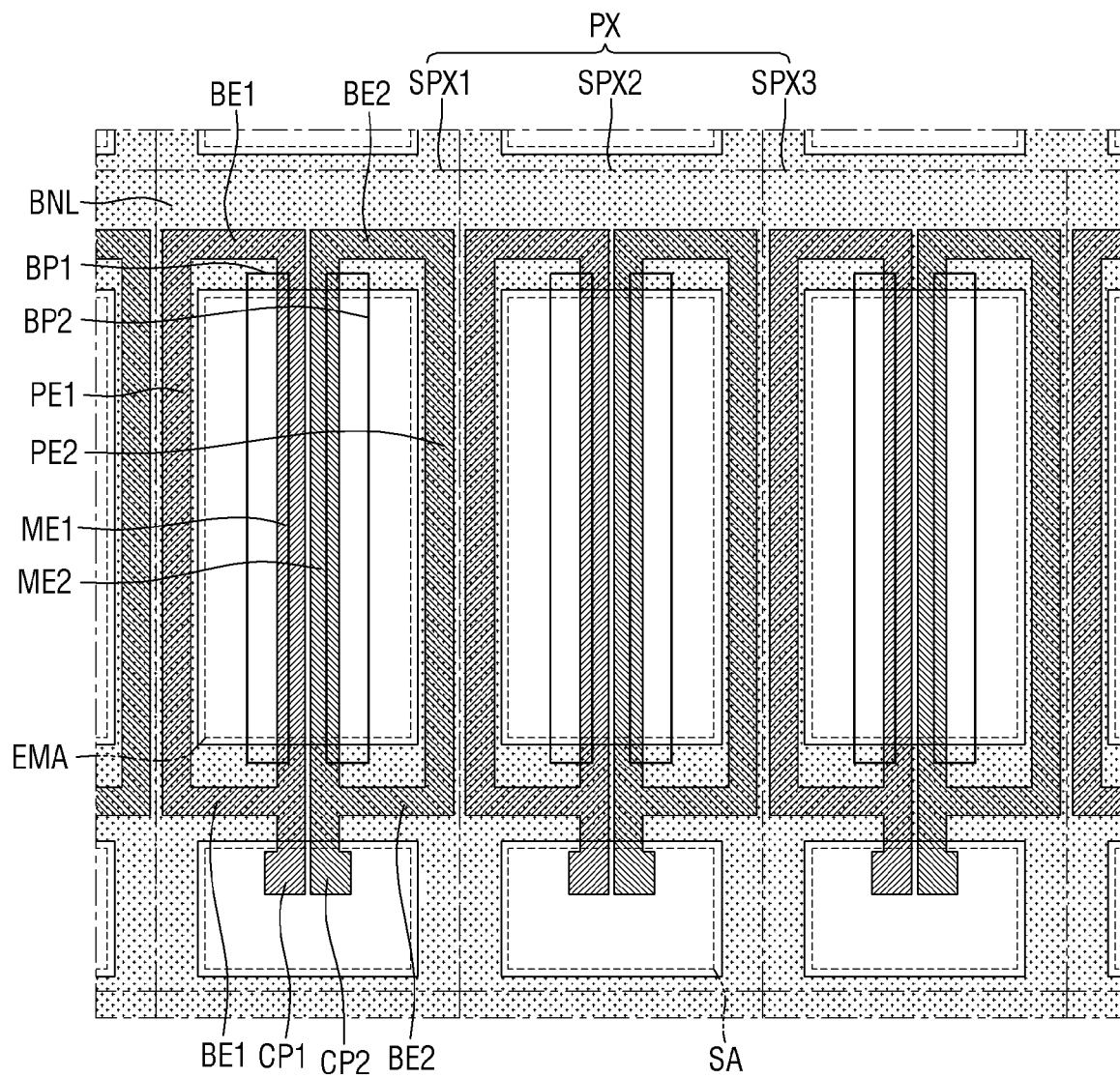
FIG. 6 is a schematic plan view illustrating connection electrodes disposed in a pixel of FIG. 5.
Figure 7:
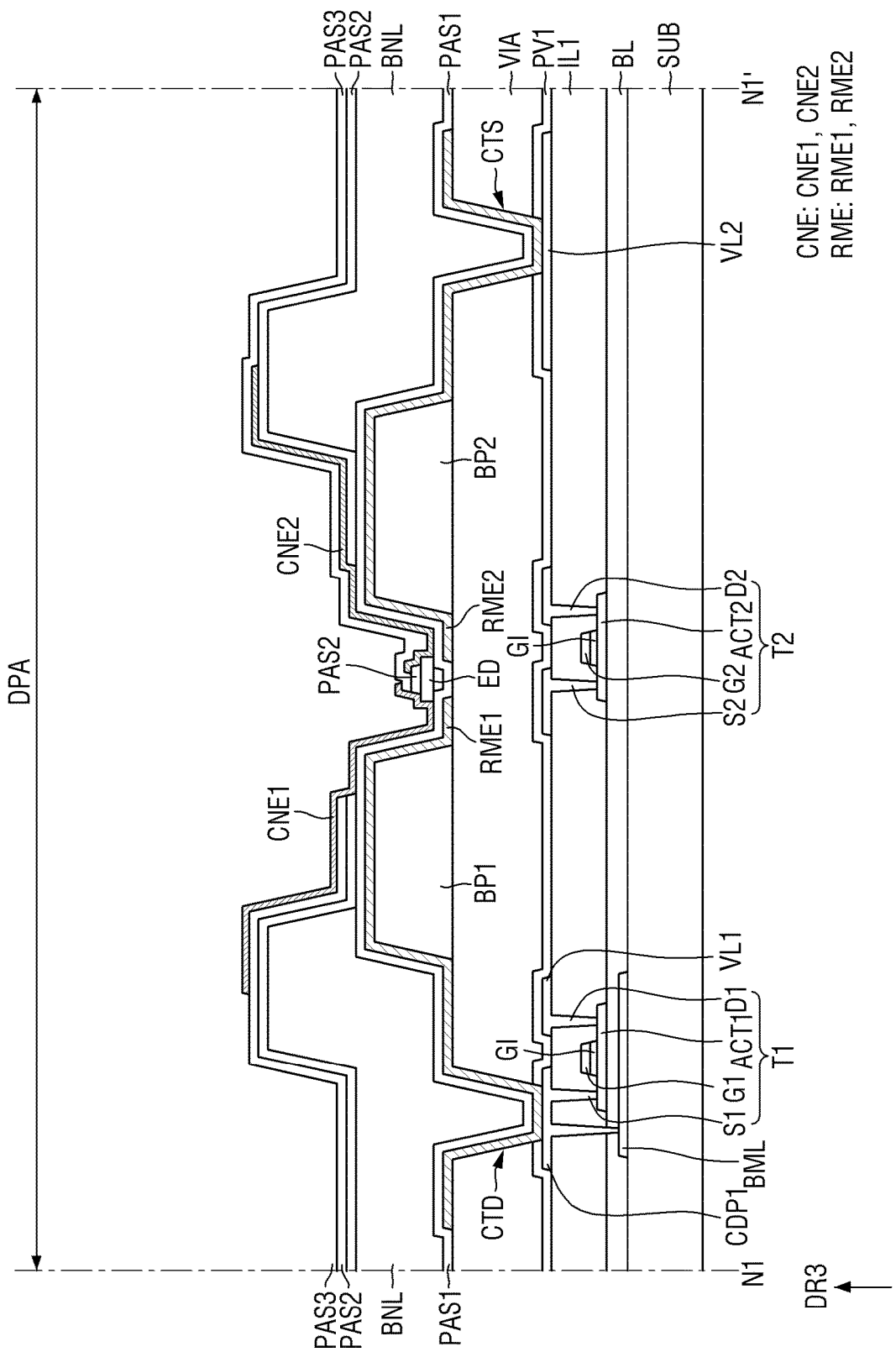
FIG. 7 is a schematic cross-sectional view taken along line N1-N1' of FIG. 5.
Figure 8:
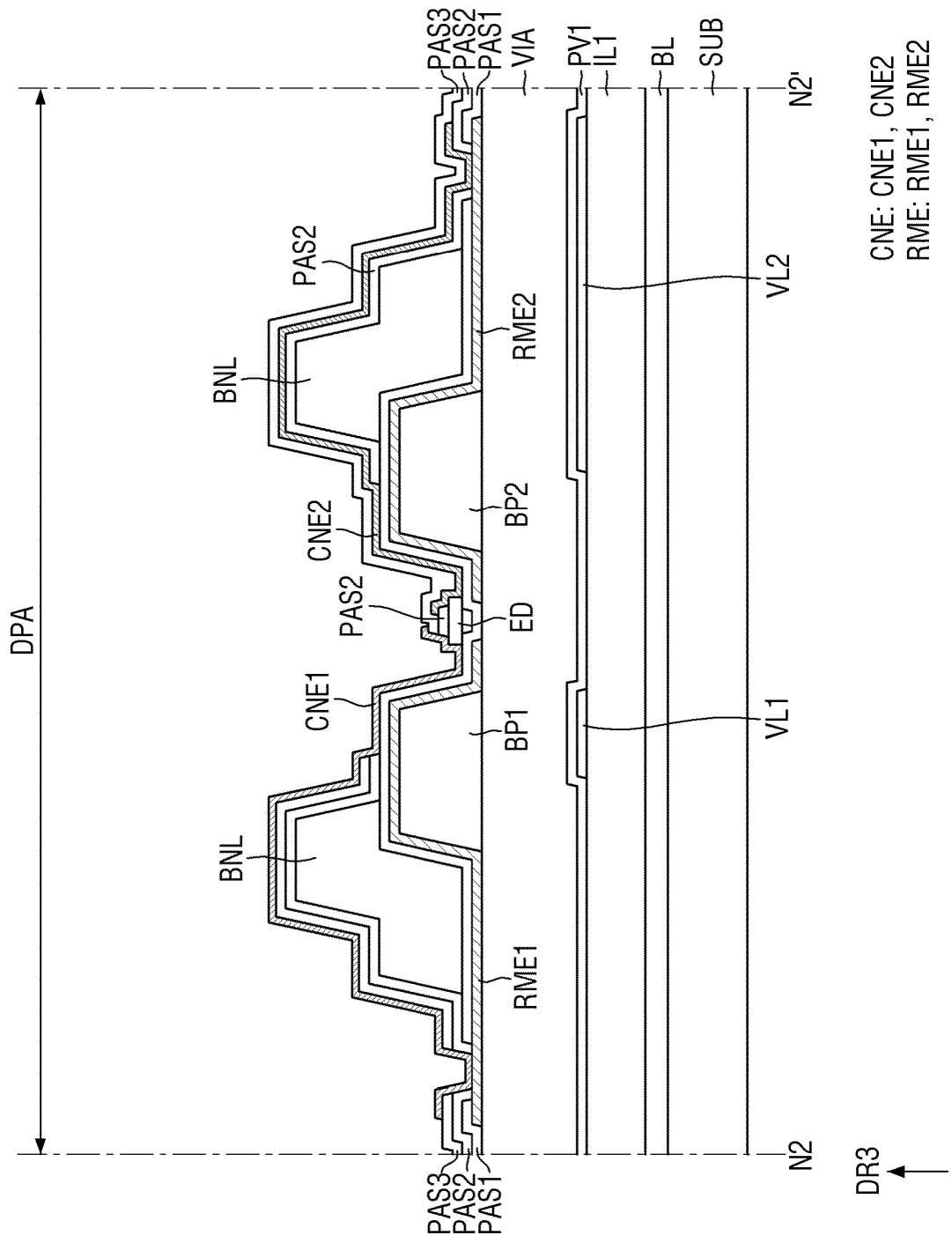
FIG. 8 is a schematic cross-sectional view taken along line N2-N2' of FIG. 5.
Figure 9:
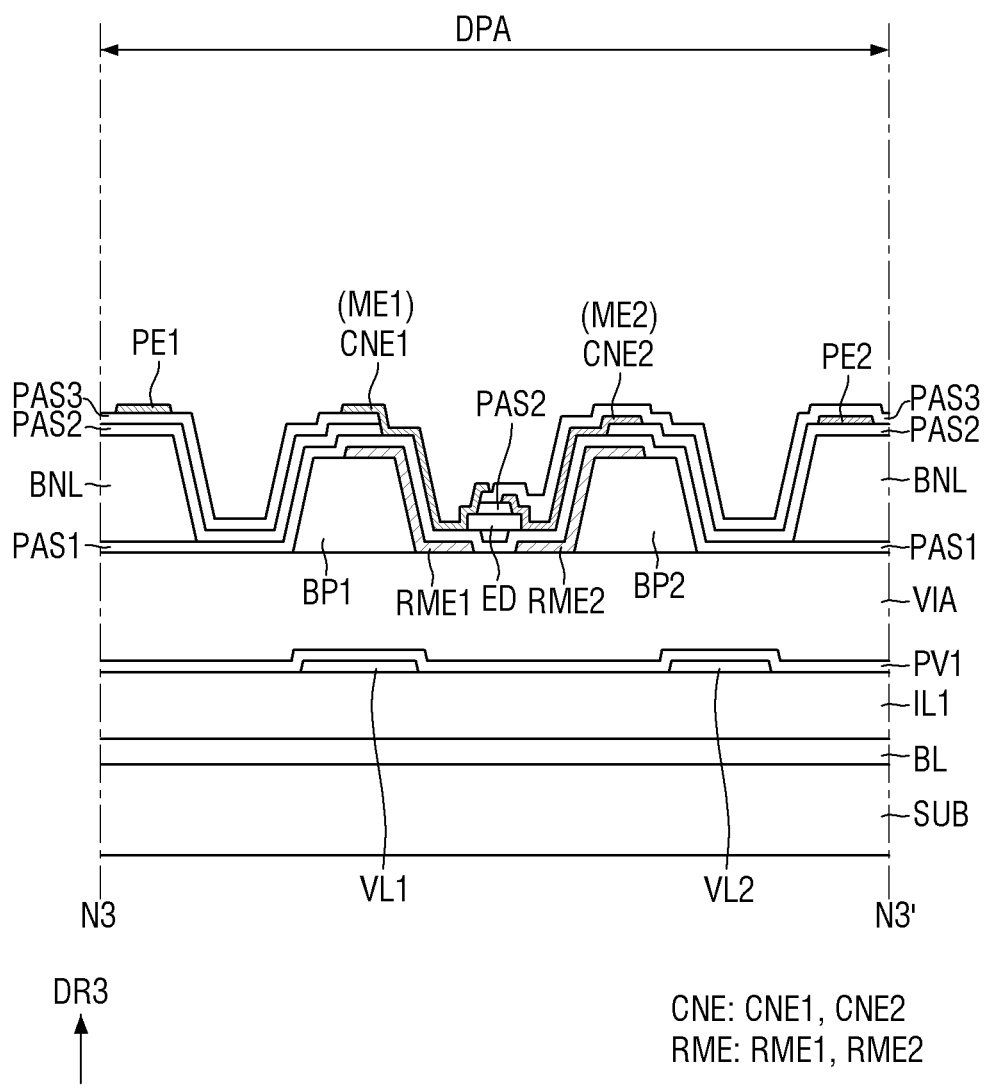
FIG. 9 is a schematic cross-sectional view taken along line N3-N3' of FIG. 5.

FIG. 6 is a schematic plan view illustrating connection electrodes disposed in a pixel of FIG. 5. FIG. 7 is a schematic cross-sectional view taken along line N1-N1' of FIG. 5. FIG. 8 is a schematic cross-sectional view taken along line N2-N2' of FIG. 5. FIG. 9 is a schematic cross-sectional view taken along line N3-N3' of FIG. 5. FIG. 6 illustrates planar arrangement of the first connection electrodes CNE1 and the second connection electrodes CNE2 disposed in a pixel PX together with the bank patterns BP1 and BP2 and the bank layer BNL. FIG. 7 illustrates a cross section across both ends of the light emitting element ED and a first electrode contact hole CTD and a second electrode contact hole CTS disposed in the first sub-pixel SPX1, and FIG. 8 illustrates a cross section across both ends of the light emitting element ED and a first contact hole CT1 and a second contact hole CT2 disposed in the first sub-pixel SPX1. FIG. 9 illustrates a cross section across both ends of the light emitting element ED and bypass portions PE1 and PE2 among the connection electrodes CNE disposed in the first sub-pixel SPX1.

Referring to FIGS. 6 to 9 in addition to FIG. 5, the display device 10 may include a first substrate SUB and a semiconductor layer, conductive layers, and insulating layers disposed on the first substrate SUB. The semiconductor layer, the conductive layers, and the insulating layers may each constitute a circuit layer and a display element layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded and/or rolled. The first substrate SUB may include the display area DPA and the non-display area NDA surrounding the display area DPA, and the display area DPA may include the emission area EMA and the sub-region SA that may be a part of the non-emission area.

A first conductive layer may be disposed on the first substrate SUB. The first conductive layer may include a lower metal layer BML that may be disposed to overlap a first active layer ACT1 of a first transistor T1. The lower metal layer BML may prevent light from being incident on the first active layer ACT1 of the first transistor T1 or may be electrically connected to the first active layer ACT1 to perform a function of stabilizing the characteristics of the first transistor T1. However, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

Although it is illustrated in the drawing that one first transistor T1 and one second transistor T2 may be disposed in the sub-pixel SPXn of the display device 10, the disclosure is not limited thereto and the display device 10 may include a larger number of transistors.

The first gate insulating layer GI may be disposed on the semiconductor layer. The first gate insulating layer GI may serve as a gate insulating layer of each of the transistors T1 and T2.

The second conductive layer may be disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that may be a thickness direction, and the second gate electrode G2 may be disposed to overlap the channel region of the second active layer ACT2 in the third direction DR3 that may be the thickness direction. Although not shown in the drawing, the second conductive layer may further include an electrode of the storage capacitor.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer ILL The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that may be disposed in the display area DPA. Although not shown in the drawing, the third conductive layer may further include another electrode of the storage capacitor.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A part of the first voltage line VL1 may be in contact with the first active layer ACT1 of the first transistor T1 through the contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 to be described later.

The first conductive pattern CDP1 may be in contact with the first active layer ACT1 of the first transistor T1 through the contact hole penetrating the first interlayer insulating layer IL1 and the first gate insulating layer GI. The first conductive pattern CDP1 may be in contact with the lower metal layer BML, through another contact hole. The first conductive pattern CDP1 may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through the contact holes penetrating the first interlayer insulating layer IL1 and the first gate insulating layer GI.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer ILL and the first passivation layer PV1 described above may be formed of inorganic layers stacked on each other in an alternating manner. For example, the buffer layer BL, the first gate insulating layer GI, the first interlayer insulating layer ILL and the first passivation layer PV1 may be formed as a double layer formed by stacking, or a multilayer formed by alternately stacking, inorganic layers including at least one of silicon oxide ($SiO_x$), silicon nitride ($SiN_x$), and silicon oxynitride ($SiO_xN_y$). However, the disclosure is not limited thereto, and the buffer layer BL, the first gate insulating layer GI, the first interlayer insulating layer ILL and the first passivation layer PV1 may be formed as a single inorganic layer containing the above-described insulating material. Further, in some embodiments, the first interlayer insulating layer IL1 may be made of an organic insulating material such as polyimide (PI) or the like.

The second conductive layer and the third conductive layer may be formed as a single layer or multiple layers made of at least one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface. However, in some embodiments, the via layer VIA may be omitted.

Bank patterns BP1 and BP2, electrodes RME (RME1 and RME2), the bank layer BNL, the light emitting elements ED, and connection electrodes CNE (CNE1 and CNE2) may be disposed on the via layer VIA. Further, insulating layers PAS1, PAS2, and PAS3 may be disposed on the via layer VIA.

The bank patterns BP1 and BP2 may be disposed in the emission area EMA of each sub-pixel SPXn. The bank patterns BP1 and BP2 may have a width in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side with respect to the center of the emission area EMA, which may be a side in the second direction DR2, and the second bank patterns BP2 may be disposed on the right side with respect to the center of the emission area EMA, which may be another side in the second direction DR2, while being spaced apart from the first bank pattern BP1. The first bank pattern BP1 and the second bank pattern BP2 may be alternately disposed along the second direction DR2 and may be disposed in an island-shaped pattern in the display area DPA. The light emitting elements ED may be arranged between the first bank pattern BP1 and the second bank pattern BP2.

The lengths of the first bank pattern BP1 and the second bank pattern BP2 in the first direction DR1 may be the same, and may be greater than the length of the emission area EMA surrounded by the bank layer BNL in the first direction DR1. The first bank pattern BP1 and the second bank pattern BP2 may partially overlap a portion of the bank layer BNL extending in the second direction DR2. However, the disclosure is not limited thereto, and the bank patterns BP1 and BP2 may be integrated with the bank layer BNL, or may be spaced apart from the portion of the bank layer BNL extending in the second direction DR2. The lengths of the bank patterns BP1 and BP2 in the first direction DR1 may be smaller than or equal to the length of the emission area EMA surrounded by the bank layer BNL in the first direction DR1.

The widths of the first bank pattern BP1 and the second bank pattern BP2 in the second direction DR2 may be the same. However, the disclosure is not limited thereto, and they may have different widths. For example, a bank pattern may have a larger width than another bank pattern, and the bank pattern having a larger width may be disposed across the emission areas EMA of different sub-pixels SPXn adjacent in the second direction DR2. In the bank pattern disposed across the emission areas EMA, a portion of the bank layer BNL extending in the first direction DR1 may overlap the second bank pattern BP2 in the thickness direction. Although it is illustrated in the drawing that two bank patterns BP1 and BP2 having the same width may be arranged for each sub-pixel SPXn, the disclosure is not limited thereto. The number and the shape of the bank patterns BP1 and BP2 may vary depending on the number or the arrangement structure of the electrodes RME.

The bank patterns BP1 and BP2 may be disposed on the via layer VIA. For example, each of the bank patterns BP1 and BP2 may be directly disposed on the via layer VIA, and may have a structure in which at least a part thereof protrudes with respect to the top surface of the via layer VIA. The protruding parts of the bank patterns BP1 and BP2 may have inclined or curved surfaces, and the light emitted from the light emitting element ED may be reflected by the electrode RME disposed on the bank patterns BP1 and BP2 and emitted in the upward direction of the via layer VIA. Unlike the example illustrated in the drawing, the bank patterns BP1 and BP2 may have a shape of a semi-circle whose outer surface may be curved in cross-sectional view. The bank patterns BP1 and BP2 may include an organic insulating material such as polyimide (PI), but are not limited thereto.

The electrodes RME (RME1 and RME2) may have a shape extending in a direction and may be disposed for each sub-pixel SPXn. The electrodes RME1 and RME2 may extend in the first direction DR1 to be disposed across the emission area EMA of the sub-pixel SPXn and the sub-region SA, and may be disposed to be spaced apart from each other in the second direction DR2. The electrodes RME may be electrically connected to the light emitting element ED to be described later, but the disclosure is not limited thereto. The electrodes RME may not be electrically connected to the light emitting element ED.

The display device 10 may include the first electrode RME1 and the second electrode RME2 arranged in each sub-pixel SPXn. The first electrode RME1 may be located on the left side with respect to the center of the emission area EMA, and the second electrode RME2 may be located on the right side with respect to the center of the emission area EMA while being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of a sub-pixel SPXn.

Although it is illustrated in the drawing that two electrodes RME have a shape extending in the first direction DR1 for each sub-pixel SPXn, the disclosure is not limited thereto. For example, the display device 10 may have a shape in which a larger number of electrodes RME may be disposed in a sub-pixel SPXn or the electrodes RME may be partially bent and have different widths depending on positions.

The first electrode RME1 and the second electrode RME2 may be arranged at least on the inclined surfaces of the bank patterns BP1 and BP2. In an embodiment, the widths of the electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be directly arranged on the via layer VIA, so that the first electrode RME1 and the second electrode RME2 may be arranged on a same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least one side surface of the bank patterns BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the disclosure is not limited thereto. In another embodiment, the electrodes RME1 and RME2 may not be electrically connected to the voltage lines VL1 and VL2 of the third conductive layer, respectively, and the connection electrode CNE to be described later may be directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. In another embodiment, the electrodes RME may have a structure in which a metal layer such as titanium (Ti), molybdenum (Mo), and niobium (Nb) and the alloy may be stacked on each other. In some embodiments, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity may be stacked on each other, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the electrodes RME. The first insulating layer PAS1 may protect the electrodes RME and insulate electrodes RME different from each other. Particularly, the first insulating layer PAS1 may be disposed to cover the electrodes RME before the bank layer BNL may be formed, so that it may be possible to prevent the electrodes RME from being damaged in a process of forming the bank layer BNL. The first insulating layer PAS1 may prevent the light emitting element ED disposed thereon from being damaged by direct contact with other members.

In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions may be formed, and thus a space may remain between the light emitting element ED and the first insulating layer PAS1.

In accordance with an embodiment, the first insulating layer PAS1 may include openings and contact holes CT1 and CT2. The first insulating layer PAS1 may include the openings formed to correspond to the separation portion ROP of the sub-region SA, and may include the contact holes CT1 and CT2 formed at the portion in which the connection electrode CNE to be described later and the electrode RME may be connected. The first insulating layer PAS1 may be disposed on the entire via layer VIA, and may partially expose the layers disposed thereunder at the portions in which the openings or the contact holes CT1 and CT2 may be formed.

At the openings formed to correspond to the separation portions ROP of the sub-regions SA, which may be the openings formed in the first insulating layer PAS1, the process of separating the electrodes RME disposed thereunder may be performed. The electrodes RME may be disposed to extend in the first direction DR1, and may be separated into the electrodes RME by etching portions exposed by the openings formed to correspond to the separation portions ROP among the openings of the first insulating layer PAS1.

The contact holes CT1 and CT2 formed in the first insulating layer PAS1 may be disposed to overlap different electrodes RME. For example, the contact holes CT1 and CT2 may be disposed in the sub-region SA, and may include the first contact holes CT1 disposed to overlap the first electrode RME1 and the second contact holes CT2 disposed in the sub-region SA to overlap the second electrode RME2. The first contact holes CT1 and the second contact holes CT2 may penetrate the first insulating layer PAS1 to partially expose the top surface of the first electrode RME1 or the second electrode RME2 thereunder. Each of the first contact hole CT1 and the second contact hole CT2 may further penetrate some of the other insulating layers disposed on the first insulating layer PAS1. The electrode RME exposed by each of the contact holes CT1 and CT2 may be in contact with the connection electrode CNE.

The bank layer BNL may be disposed on the first insulating layer PAS1. The bank layer BNL may include portions extending in the first direction DR1 and the second direction DR2, and may surround the sub-pixels SPXn. The bank layer BNL may surround and distinguish the emission area EMA and the sub-region SA of each sub-pixel SPXn, and may surround the outermost part of the display area DPA and distinguish the display area DPA and the non-display area NDA. The bank layer BNL may be disposed in the entire display area DPA to form a grid pattern, and the regions exposed by the bank layer BNL in the display area DPA may be the emission area EMA and the sub-region SA.

Similarly to the bank patterns BP1 and BP2, the bank layer BNL may have a certain height. In some embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similarly to the bank patterns BP1 and BP2, the bank layer BNL may include an organic insulating material such as polyimide.

The light emitting elements ED may be arranged in the emission area EMA. The light emitting elements ED may be disposed between the bank patterns BP1 and BP2, and may be arranged to be spaced apart from each other in the first direction DR1. In an embodiment, the light emitting elements ED may have a shape extending in a direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The light emitting elements ED may be arranged on the first insulating layer PAS1. The light emitting element ED may have a shape extending in a direction, and may be disposed such that a direction in which the light emitting element ED extends may be parallel to the top surface of the first substrate SUB. As will be described later, the light emitting element ED may include semiconductor layers arranged along a direction in which the light emitting element ED extends, and the semiconductor layers may be sequentially arranged along the direction parallel to the top surface of the first substrate SUB. However, the disclosure is not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in contact with the connection electrodes CNE (CNE1 and CNE2), and may emit light of a specific wavelength band by receiving an electrical signal.

In accordance with an embodiment, the light emitting element ED may have a first end disposed on the first electrode RME1 and a second end disposed on the second electrode RME2, the first end and the second end being in electrical contact with different connection electrodes CNE.

The second insulating layer PAS2 may be disposed on the light emitting elements ED, the first insulating layer PAS1, and the bank layer BNL. The second insulating layer PAS2 may include a pattern portion disposed on the light emitting elements ED while extending in the first direction DR1 between the bank patterns BP1 and BP2. The pattern portion may be disposed to partially surround the outer surface of the light emitting element ED, and may not cover both sides or both ends of the light emitting element ED. The pattern portion may form a linear or island-like pattern in each sub-pixel SPXn in plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a part of the second insulating layer PAS2 may be disposed on the bank layer BNL and in the sub-regions SA.

The second insulating layer PAS2 may include openings and the contact holes CT1 and CT2. The second insulating layer PAS2 may include the openings formed to correspond to the separation portions ROP of the sub-regions SA, and the contact holes CT1 and CT2 formed at the portion in which the connection electrode CNE and the electrode RME may be connected. The second insulating layer PAS2 may be disposed on the entire first insulating layer PAS1, and may partially expose the layers disposed thereunder at the portions in which the openings may be formed.

At the openings formed to correspond to the separation portions ROP of the sub-regions SA, which may be the openings formed in the second insulating layer PAS2, the process of separating the electrodes RME disposed thereunder may be performed. Similarly to the first insulating layer PAS1, the second insulating layer PAS2 may include the opening exposing the top surface of the via layer VIA at the separation portion ROP in which the process of separating the electrodes RME may be performed.

The second insulating layer PAS2 may include the first contact holes CT1 disposed in the sub-region SA to overlap the first electrode RME1, and the second contact holes CT2 disposed in the sub-region SA to overlap the second electrode RME2. The contact holes CT1 and CT2 may penetrate the second insulating layer PAS2 in addition to the first insulating layer PAS1. The first contact holes CT1 and the second contact holes CT2 may partially expose the top surface of the first electrode RME1 or the second electrode RME2 disposed thereunder.

The connection electrodes CNE (CNE1 and CNE2) may be disposed on the electrodes RME and the bank patterns BP1 and BP2. The connection electrodes CNE may each have a shape partially extending in a direction, and may be disposed to be spaced apart from each other. Each of the connection electrodes CNE may be in contact with the light emitting element ED, and may be electrically connected to the third conductive layer.

The connection electrodes CNE may include the first connection electrode CNE1 and the second connection electrode CNE2 disposed in each sub-pixel SPXn. The first connection electrode CNE1 may be disposed on the first electrode RME1 or the first bank pattern BP1. The second connection electrode CNE2 may be disposed on the second electrode RME2 or the second bank pattern BP2. The first connection electrode CNE1 and the second connection electrode CNE2 may be partially disposed on the bank layer BNL. In accordance with an embodiment, the first connection electrode CNE1 and the second connection electrode CNE2 may be connection electrodes disposed on different layers. The second connection electrode CNE2 may be a first connection electrode layer disposed on the second insulating layer PAS2, and the first connection electrode CNE may be a second connection electrode layer disposed on a third insulating layer PAS3.

The connection electrodes CNE may be in contact with the light emitting elements ED. For example, the first connection electrode CNE1 may partially overlap the first electrode RME1 and may be in contact with the first ends of the light emitting elements ED. The second connection electrode CNE2 may partially overlap the second electrode RME2 and may be in contact with the second ends of the light emitting elements ED.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

In accordance with an embodiment, the connection electrodes CNE1 and CNE2 may include main portions ME1 and ME2 in contact with the light emitting element ED and the bypass portions PE1 and PE2 disposed on the bank layer BNL, connection portions BE1 and BE2 connecting the main portions ME1 and ME2 to the bypass portions PE1 and PE2, and contact portions CP1 and CP2 connected to the electrodes RME1 and RME2 through the contact holes CT1 and CT2, respectively.

The first connection electrode CNE1 may include a first main portion ME1 disposed in the emission area EMA and in contact with the first ends of the light emitting elements ED, and the second connection electrode CNE2 may include a second main portion ME2 disposed in the emission area EMA and in contact with the second ends of the light emitting elements ED.

The first connection electrode CNE1 may include a first bypass portion PE1 partially spaced apart from the first main portion ME1 and disposed on the bank layer BNL, and the second connection electrode CNE2 may include a second bypass portion PE2 partially spaced apart from the second main portion ME2 and disposed on the bank layer BNL. The first connection electrode CNE1 may include first connection portions BE1 connecting the first main portion ME1 to the first bypass portion PE1, and the second connection electrode CNE2 may include second connection portions BE2 connecting the second main portion ME2 to the second bypass portion PE2. The main portions ME1 and ME2, the bypass portions PE1 and PE2, the connection portions BE1 and BE2, and the contact portions CP1 and CP2 of the respective connection electrodes CNE1 and CNE2 may be integrally connected to each other. However, the disclosure is not limited thereto, and some of them may be disposed on different layers or made of different materials and may be electrically connected to each other. The connection electrodes CNE1 and CNE2 may include, in addition to the contact portions CP1 and CP2 in contact with the electrode RME and the main portions ME1 and ME2 in contact with the light emitting elements ED, the bypass portions PE1 and PE2 and the connection portions BE1 and BE2 electrically connected thereto, respectively.

The main portions ME1 and ME2 and the bypass portions PE1 and PE2 of the respective connection electrodes CNE1 and CNE2 may extend in the first direction DR1 and may be partially spaced apart from each other in the second direction DR2. The connection portions BE1 and BE2 of the connection electrodes CNE1 and CNE2 may extend in the second direction DR2 to connect the main portions ME1 and ME2 to the bypass portions PE1 and PE2, respectively. The first main portion ME1 and the second main portion ME2 may be disposed in the emission area EMA in which the light emitting elements ED may be disposed, and may be in direct contact with the light emitting element ED. The first main portion ME1 and the second main portion ME2 may be partially disposed between the bank patterns BP1 and BP2, and may overlap the electrode RME and the bank patterns BP1 and BP2, respectively.

The first bypass portion PE1 and the second bypass portion PE2 may be disposed on the bank layer BNL as the non-emission area where the light emitting elements ED may not be disposed. The first bypass portion PE1 and the second bypass portion PE2 may not be in contact with the light emitting element ED, and may be electrically connected to the main portions ME1 and ME2. The first bypass portion PE1 and the second bypass portion PE2 may not overlap the electrode RME and the bank patterns BP1 and BP2, respectively.

The first connection portions BE1 and second connection portions BE2 may be disposed on the bank layer BNL as the non-emission area where the light emitting elements ED may not be disposed. The first connection portions BE1 and the second connection portions BE2 may not be in contact with the light emitting element ED, and may be connected to the main portions ME1 and ME2. The main portions ME1 and ME2 may be partially disposed on the bank layer BNL while extending in the first direction DR1, and the connection portions BE1 and BE2 may be connected to the portions of the main portions ME1 and ME2 that may be disposed on the bank layer BNL, respectively. Each of the connection electrodes CNE may include one or more connection portions BE1 and BE2, and they may be disposed between the emission area EMA and the sub-region SA. A connection portion may be disposed on the lower side of the emission area EMA that may be an area between the emission area EMA and the sub-region SA of the corresponding sub-pixel SPXn, and another connection portion may be disposed on the upper side of the emission area EMA that may be an area between the emission area EMA and the sub-region SA of another sub-pixel SPXn. The connection portions BE1 and BE2 may be connected to both sides of the main portions ME1 and ME2 in the first direction DR1 to electrically connect the main portions ME1 and ME2 to the bypass portions PE1 and PE2, respectively. Although a structure in which one connection electrode CNE includes two connection portions BE1 and BE2 is illustrated in the drawing, the disclosure is not limited thereto. One connection electrode CNE may include a larger number of connection portions BE1 and BE2, or the connection portions BE1 and BE2 may be omitted.

The first connection electrode CNE1 may be in contact with the first electrode RME1 through the first contact hole CT1 penetrating the first insulating layer PAS1, the second insulating layer PAS2, and the third insulating layer PAS3 in the sub-region SA. In the first connection electrode CNE1, the first contact portion CP1 disposed in the sub-region SA may be in contact with the first electrode RME1 through the first contact hole CT1. The second connection electrode CNE2 may be in contact with the second electrode RME2 through the second contact hole CT2 penetrating the first insulating layer PAS1 and the second insulating layer PAS2 in the sub-region SA. In the second connection electrode CNE2, the second contact portion CP2 disposed in the sub-region SA may be in contact with the second electrode RME2 through the second contact hole CT2. The main portions ME1 and ME2 of the connection electrode CNE may be electrically connected to the contact portions CP1 and CP2 to transmit the electrical signal applied from the electrode RME to the light emitting elements ED. The bypass portions PE1 and PE2 and the connection portions BE1 and BE2 of the connection electrode CNE may be electrically connected to the main portions ME1 and ME2, and may receive the electrical signals applied from the contact portions CP1 and CP2, respectively. In another embodiment, the bypass portions PE1 and PE2 and the connection portions BE1 and BE2 of the connection electrode CNE may be electrically connected to the contact portions CP1 and CP2, respectively.

Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may be in contact with the light emitting element ED in the emission area EMA to transmit the power voltage to the light emitting element ED. However, the disclosure is not limited thereto. In some embodiments, the connection electrodes CNE may be in direct contact with the third conductive layer, and may be electrically connected to the third conductive layer through patterns other than the electrodes RME.

The third insulating layer PAS3 may be disposed on the first connection electrode layer and the second insulating layer PAS2. The third insulating layer PAS3 may be disposed on the entire second insulating layer PAS2 to cover the second connection electrode CNE2 of the first connection electrode layer, and the second connection electrodes CNE2 of the second connection electrode layer may be partially disposed on the third insulating layer PAS3. The third insulating layer PAS3 may insulate the connection electrode CNE1 of the first connection electrode layer from the connection electrode CNE2 of the second connection electrode layer to prevent direct contact therebetween.

The third insulating layer PAS3 may include the first contact holes CT1. The third insulating layer PAS3 may include the first contact holes CT1 formed at the portion in which the first connection electrode CNE1 of the second connection electrode layer may be connected to the electrode RME. The third insulating layer PAS3 may be disposed on the entire second insulating layer PAS2 and may partially expose the layers disposed thereunder at the portions in which the openings may be formed.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may include an inorganic insulating material. In another embodiment, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which insulating layers may be stacked alternately or repeatedly on each other. In an embodiment, the first insulating layer PAS1, the second insulating layer PAS2, and the third insulating layer PAS3 may be at least one of silicon oxide (SiO$_x$), silicon nitride (SiN$_x$), and silicon oxynitride (SiO$_x$N$_y$). The first insulating layer PAS1, the second insulating layer PAS2, and the third insulating layer PAS3 may be made of the same material or different materials. In another embodiment, some of them may be made of the same material and some of them may be made of different materials.

In accordance with an embodiment, in the display device 10, the light emitting elements ED may be aligned in the emission area EMA, and the connection electrodes CNE may be formed to electrically connect the light emitting elements ED to the electrode RME or a circuit layer disposed thereunder. In case that the light emitting elements ED are aligned to be spaced apart from each other between the bank patterns BP1 and BP2 and on the electrodes RME, the connection electrodes CNE disposed on the light emitting elements ED may be in contact with the light emitting elements ED without occurrence of disconnection. The main portions ME1 and ME2 of the connection electrodes CNE may be in direct contact with the light emitting elements ED, and may transmit the electrical signal applied from the electrode RME to the light emitting elements ED through the contact portions CP1 and CP2.

However, in case that the light emitting elements ED are disposed between the bank patterns BP1 and BP2 in a partially aggregated state, the main portions ME1 and ME2 of the connection electrodes CNE disposed thereon may be partially disconnected. An electrical signal may not be transmitted to the portion that may not be connected to the contact portions CP1 and CP2 with respect to the portion in which the main portions ME1 and ME2 may be disconnected, and the light emitting elements ED disposed in the corresponding portion may not emit light. To this end, the connection electrode CNE may include the bypass portions PE1 and PE2 and the connection portions BE1 and BE2 electrically connected to the contact portions CP1 and CP2 and connected to the main portions ME1 and ME2, so that even if the main portions ME1 and ME2 may be partially disconnected, electric signals may be transmitted to the main portions ME1 and ME2 except the disconnected portions. Unlike the main portions ME1 and ME2, the connection portions BE1 and BE2, the bypass portions PE1 and PE2, and the contact portions CP1 and CP2 may be disposed in an area where the light emitting elements ED may not be disposed, e.g., on the bank layer BNL, or in the sub-region SA, so that it may be possible to prevent occurrence of disconnection by the light emitting element ED.

In the display device 10, the connection electrode CNE may include the bypass portions PE1 and PE2 and the connection portions BE1 and BE2 respectively electrically connected to the main portions ME1 and ME2 in contact with the light emitting element ED and the contact portions CP1 and CP2 in contact with the electrode RME, so that it may be possible to prevent defects caused by the disconnection of the main portions ME1 and ME2. In the display device 10, the number of light emitting elements ED remaining as non-emission elements in each sub-pixel SPXn may be reduced, so that it may be possible to prevent the occurrence of dark spots in the sub-pixel SPXn and poor light emission amount.

Figure 10:
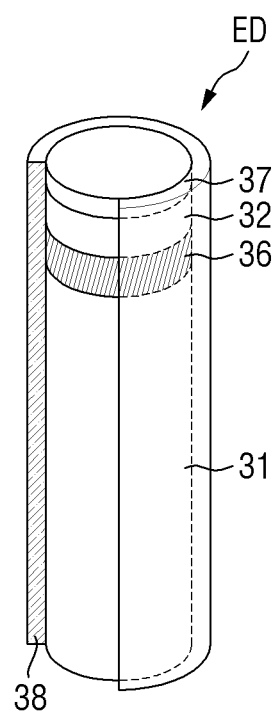
FIG. 10 is a schematic diagram of a light emitting element according to an embodiment.

FIG. 10 is a schematic diagram of a light emitting element according to an embodiment.

Referring to FIG. 10, the light emitting element ED may be a light emitting diode. Specifically, the light emitting element ED may be an inorganic light emitting diode that has a nanometer or micrometer size, and may be made of an inorganic material. The light emitting element ED may be aligned between two electrodes having polarity in case that an electric field may be formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of Al$_x$Ga$_y$In$_{1-x-y}$N (0≤x≤1, 0≤y≤1, 0≤x+y≤1). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of Al$_x$Ga$_y$In$_{1-x-y}$N (0≤x≤1, 0≤y≤1, 0≤x+y≤1). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 may be configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately on each other. The light emitting layer 36 may emit light by coupling of electronhole pairs according to an electrical signal applied through the first semiconductor layer 31 and the second semiconductor layer 32. The light emitting layer 36 may include a material such as AlGaN, AlGaInN, and/or InGaN. In particular, in case that the light emitting layer 36 has a multiple quantum well structure in which quantum layers and well layers are alternately stacked on each other, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked on each other, and may include other group III to V semiconductor materials according to the wavelength band of the emitted light. The light emitted by the light emitting layer 36 may not be limited to the light of the blue wavelength band, but the light emitting layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, and ITZO.

The insulating film 38 may be arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which may be rounded in a region adjacent to at least an end of the light emitting element ED.

The insulating film 38 may include at least one of materials having insulating properties, for example, silicon oxide (SiO$_x$), silicon nitride (SiN$_x$), silicon oxynitride (SiO$_x$N$_y$), aluminum nitride (AlN$_x$), aluminum oxide (AlO$_x$), zirconium oxide (ZrO$_x$), hafnium oxide (HfO$_x$), and titanium oxide (TiO$_x$). It is illustrated in the drawing that the insulating film 38 may be formed as a single layer, but the disclosure is not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that may be likely to occur at the light emitting layer 36 in case that an electrode to which an electrical signal may be transmitted may be in direct contact with the light emitting element ED. The insulating film 38 may prevent a decrease in luminous efficiency of the light emitting element ED.

Further, the insulating film 38 may have an outer surface which may be surface-treated. The light emitting elements ED may be aligned in such a way of spraying the ink in which the light emitting elements ED may be dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, even more embodiments of the display device 10 will be described with reference to other drawings.

Figure 11:
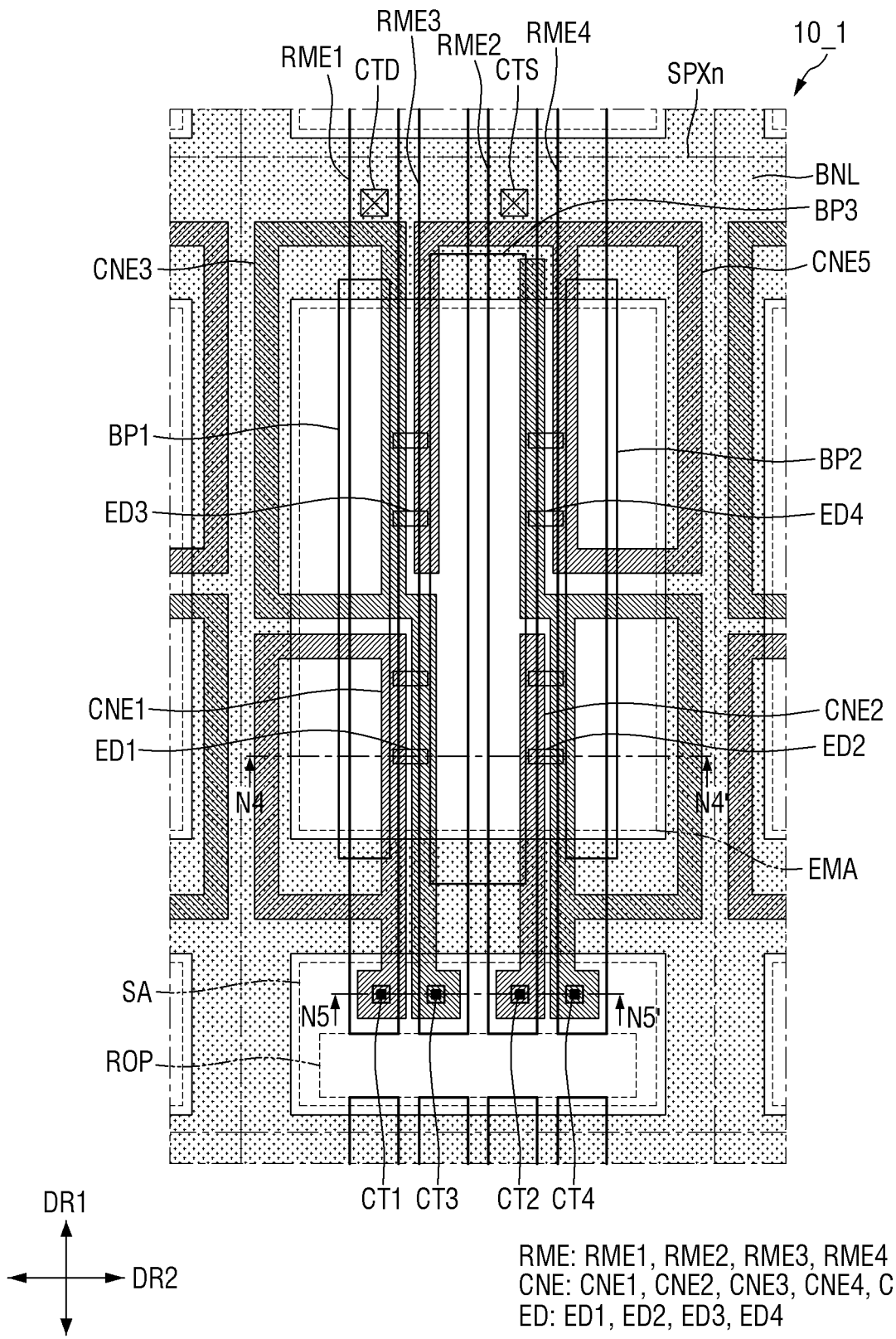
FIG. 11 is a schematic plan view illustrating a sub-pixel of a display device according to another embodiment.
Figure 12:
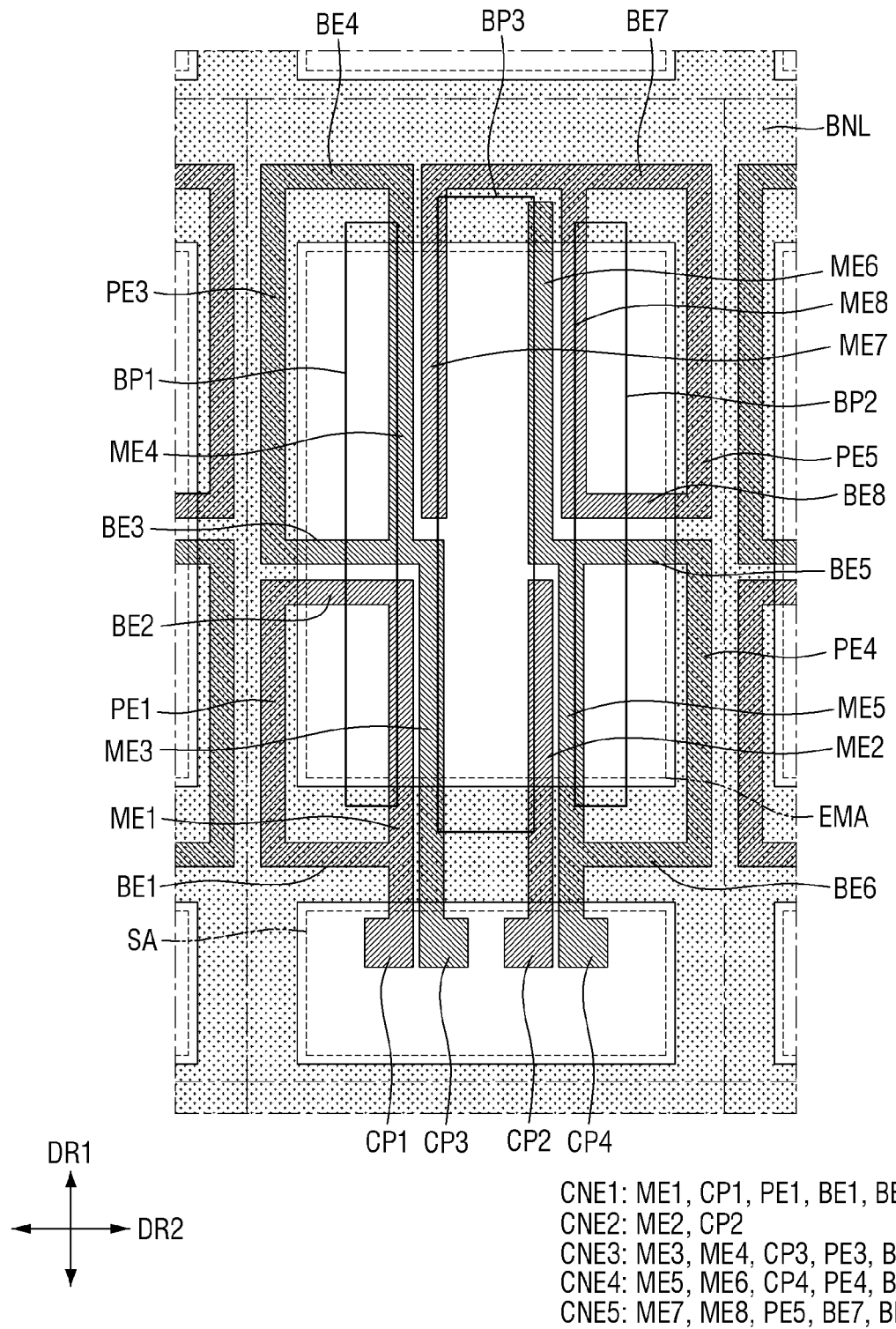
FIG. 12 is a schematic plan view illustrating connection electrodes disposed in a sub-pixel of FIG. 11.
Figure 13:
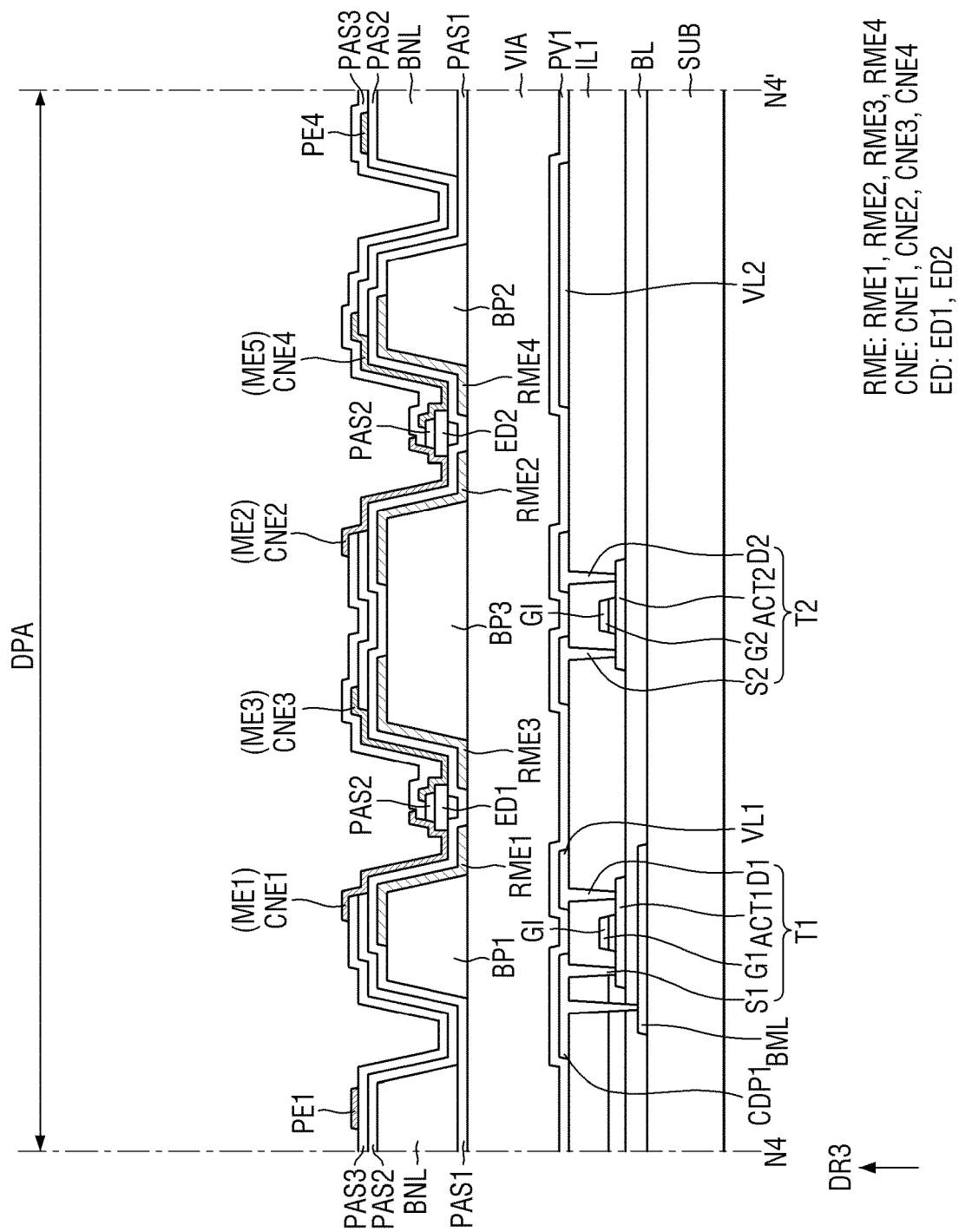
FIG. 13 is a schematic cross-sectional view taken along line N4-N4' of FIG. 11.
Figure 14:
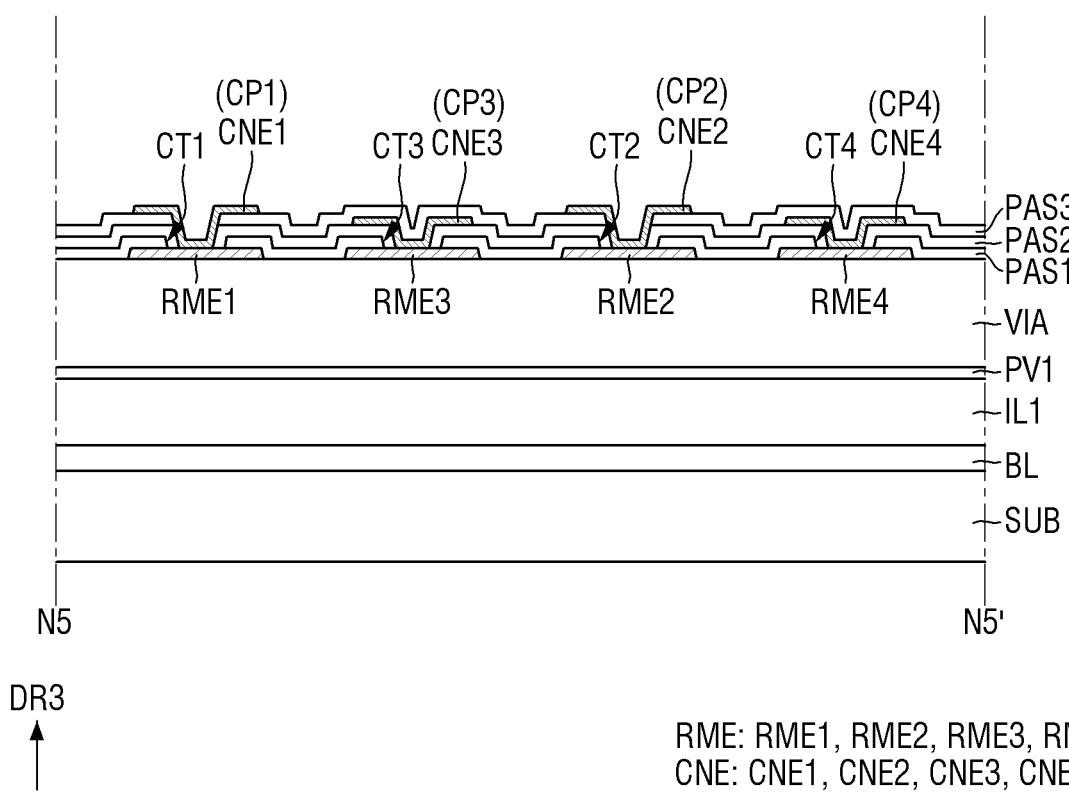
FIG. 14 is a schematic cross-sectional view taken along line N5-N5' of FIG. 11.

FIG. 11 is a schematic plan view illustrating a sub-pixel of a display device according to another embodiment. FIG. 12 is a schematic plan view illustrating connection electrodes disposed in a sub-pixel of FIG. 11. FIG. 13 is a schematic cross-sectional view taken along line N4-N4' of FIG. 11. FIG. 14 is a schematic cross-sectional view taken along line N5-N5' of FIG. 11.

FIG. 11 illustrates planar arrangement of electrodes RME (RME1, RME2, RME3, and RME4), bank patterns BP1, BP2, and BP3, the bank layer BNL, the light emitting elements ED, connection electrodes CNE (CNE1, CNE2, CNE3, CNE4, and CNE5) disposed in a sub-pixel SPXn of a display device 10_1. FIG. 12 illustrates planar arrangement of the bank patterns BP1, BP2, and BP3, the bank layer BNL, the light emitting elements ED, and the connection electrodes CNE (CNE1, CNE2, CNE3, CNE4, and CNE5) disposed in a sub-pixel SPXn of the display device 10_1. FIG. 13 illustrates a cross section across both ends of the first light emitting element ED1 and the second light emitting element ED2 disposed in a sub-pixel SPXn, and FIG. 14 illustrates a cross section across contact holes CT1, CT2, CT3, and CT4 disposed in a sub-pixel SPXn.

Referring to FIGS. 11 to 14, the display device 10_1 according to an embodiment may include a larger number of electrodes RME (RME1, RME2, RME3, and RME4), a larger number of bank patterns BP1, BP2, and BP3, and a larger number of light emitting elements ED (ED1, ED2, ED3, and ED4), and a larger number of connection electrodes CNE (CNE1, CNE2, CNE3, CNE4, CNE5). The display device 10_1 according to an embodiment may be different from an embodiment of FIG. 5 at least in that a larger number of electrodes and a larger number of light emitting elements may be included in each sub-pixel SPXn.

The bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Among the electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, whereas the third electrode RME3 and the fourth electrode RME4 may not be in contact with them.

The first insulating layer PAS1 may be disposed in a structure similar to that of the above-described embodiment. The first insulating layer PAS1 may be disposed in the entire display area DPA and may cover the electrodes RME and the bank patterns BP1, BP2, and BP3.

In accordance with an embodiment, the first insulating layer PAS1 may include the openings and the contact holes CT1, CT2, CT3, and CT4. The opening disposed to correspond to the separation portion ROP, which may be the opening of the first insulating layer PAS1, may be the same as that described above. The contact holes CT1, CT2, CT3, and CT4 formed in the first insulating layer PAS1 may be disposed to overlap different electrodes RME. For example, the contact holes CT1, CT2, CT3, and CT4 may be disposed in the sub-region SA, and may include the first contact hole CT1 disposed to overlap the first electrode RME1, the second contact hole CT2 disposed to overlap the second electrode RME2, the third contact hole CT3 disposed to overlap the third electrode RME3, and the fourth contact hole CT4 disposed to overlap the fourth electrode RME4. The contact holes CT1, CT2, CT3, and CT4 may penetrate the first insulating layer PAS1 to partially expose the top surfaces of the electrodes RME1, RME2, RME3, and RME4 disposed thereunder, respectively. Each of the contact holes CT1, CT2, CT3, and CT4 may further penetrate some of the other insulating layers disposed on the first insulating layer PAS1.

The light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with an embodiment, the light emitting elements ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The second insulating layer PAS2 may be disposed in a structure similar to that of the above-described embodiment. The second insulating layer PAS2 may be disposed on the light emitting elements ED, the first insulating layer PAS1, and the bank layer BNL.

In accordance with an embodiment, the second insulating layer PAS2 may include the openings and the contact holes CT1, CT2, CT3, and CT4. The opening formed to correspond to the separation portion ROP of the sub-region SA, which may be the opening of the second insulating layer PAS2, may be the same as that described above.

The contact holes CT1, CT2, CT3, and CT4 formed on the second insulating layer PAS2 may be disposed to overlap different electrodes RME. For example, the contact holes CT1, CT2, CT3, and CT4 may be disposed in the sub-region SA, and may include the first contact hole CT1 disposed to overlap the first electrode RME1, the second contact hole CT2 disposed to overlap the second electrode RME2, the third contact hole CT3 disposed to overlap the third electrode RME3, and the fourth contact hole CT4 disposed to overlap the fourth electrode RME4. The contact holes CT1, CT2, CT3, and CT4 may penetrate the second insulating layer PAS2 to partially expose the top surfaces of the electrodes RME1, RME2, RME3, and RME4 disposed thereunder, respectively. Some of the contact holes CT1, CT2, CT3, and CT4 may further penetrate another insulating layer disposed on the second insulating layer PAS2.

The connection electrodes CNE may include main portions ME1, ME2, ME3, ME4, ME5, MEG, ME7, and ME8, and contact portions CP1, CP2, CP3, and CP4, respectively. Further, some connection electrodes CNE may include bypass portions PE1, PE3, PE4, and PE5 and connection portions BE1, BE2, BE3, BE4, BE5, BE6, BE7, and BE8. The first connection electrode CNE1 and the second connection electrode CNE2 may be disposed on the lower side with respect to the center of the emission area EMA, and the third connection electrode CNE3 and the fourth connection electrode CNE4 may be disposed across the upper side and the lower side of the emission area EMA. The fifth connection electrode CNE5 may be disposed on the upper side with respect to the center of the emission area EMA.

The connection electrode CNE may include, in addition to the first connection electrode CNE1 including the first main portion ME1 disposed on the first electrode RME1 and the second connection electrode CNE2 including the second main portion ME2 disposed on the second electrode RME2, the third connection electrode CNE3, the fourth connection electrode CNE4, and the fifth connection electrode CNE5 including the main portions ME3 to ME8 disposed on different electrodes RME.

The third connection electrode CNE3 may include a third main portion ME3 disposed on the third electrode RME3, and a fourth main portion ME4 disposed on the first electrode RME1. The third main portion ME3 may be disposed between the first main portion ME1 of the first connection electrode CNE1 and the second main portion ME2 of the second connection electrode CNE2, and may be spaced apart therefrom in the second direction DR2. The fourth main portion ME4 may be spaced apart from the first main portion ME1 of the first connection electrode CNE1 in the first direction DR1.

The fourth connection electrode CNE4 may include a fifth main portion ME5 disposed on the fourth electrode RME4, and a sixth main portion MEG disposed on the second electrode RME2. The fifth main portion ME5 may be spaced apart from the second main portion ME2 of the second connection electrode CNE2 in the second direction DR2. The sixth main portion MEG may be spaced apart from the second main portion ME2 of the second connection electrode CNE2 in the first direction DR1.

The fifth connection electrode CNE5 may include a seventh main portion MET disposed on the third electrode RME3, and an eighth main portion ME5 disposed on the fourth electrode RME4. The seventh main portion MET may be disposed between the fourth main portion ME4 of the third connection electrode CNE3 and the sixth main portion MEG of the fourth connection electrode CNE4, and may be spaced apart therefrom in the second direction DR2. The seventh main portion MET may be spaced apart from the third main portion ME3 of the third connection electrode CNE3 in the first direction DR1, and the eighth main portion ME8 may be spaced apart from the fifth main portion ME5 of the fourth connection electrode CNE4 in the first direction DR1 and may be spaced apart from the sixth main portion MEG in the second direction DR2.

The main portions ME1 to ME5 of the connection electrodes CNE may be classified into main portions ME1, ME4, ME5, and ME5 disposed at the outermost part and main portions ME2, ME3, MEG, and MET disposed at the inner part. The outermost main portions may be disposed on the electrodes RME1 and RME4 disposed at the outer part, and the inner main portions may be disposed on the electrodes RME2 and RME4 disposed at the inner part. For example, each of the first main portion ME1, the fourth main portion ME4, the fifth main portion ME5, and the eighth main portion ME5 may be disposed on the first electrode RME1 or the fourth electrode RME4, and each of the second main portion ME2, the third main portion ME3, the sixth main portion MEG, and the seventh main portion MET may be disposed on the second electrode RME2 or the third electrode RME3.

In accordance with an embodiment, some of the connection electrodes CNE may include the connection portions BE1 to BE8 and the bypass portions PE1, PE3, PE4, and PE5 connected to the main portions ME1 to ME5 in order to prevent non-emission failure of the light emitting element ED by the disconnection of the main portions ME1 to ME8. Further, some connection electrodes CNE may include two or more main portions and a connection portion connecting them.

The first connection electrode CNE1 may include the first bypass portion PE1 spaced apart from the first main portion ME1 in the second direction DR2, and the first connection portion BE1 and the second connection portion BE2 connected to the first bypass portion PE1 and the first main portion ME1. The first bypass portion PE1 may be disposed on the bank layer BNL. The first connection portion BE1 may be disposed on a portion of the bank layer BNL extending in the second direction DR2, and may be connected to a portion of the first main portion ME1 disposed on the bank layer BNL and the first bypass portion PE1. The second connection portion BE2 may be disposed in the emission area EMA and may be connected to a side of the first main portion ME1 disposed in the emission area EMA and the first bypass portion PE1. The first connection electrode CNE1 may include the first main portion ME1 that may be the outermost main portion, and may further include the first bypass portion PE1, the first connection portion BE1, and the second connection portion BE2 for preventing defects caused by the disconnection of the first main portion ME1. The first main portion ME1, the first bypass portion PE1, the first connection portion BE1, and the second connection portion BE2 of the first connection electrode CNE1 may be integrally connected to each other, and each of them may be electrically connected to the first contact portion CP1 to be described later.

The second connection electrode CNE2 may include the second main portion ME2 that may be the inner main portion. The second connection electrode CNE2 may not include the bypass portion and the connection portion, and the second main portion ME2 may be electrically connected to the second contact portion CP2 to be described later.

The third connection electrode CNE3 may include a third bypass portion PE3 spaced apart from the fourth main portion ME4 in the second direction DR2, the third main portion ME3, a third connection portion BE3 connected to the fourth main portion ME4 and the third bypass portion PE3, and a fourth connection portion BE4 connected to the third bypass portion PE3 and the fourth main portion ME4. The third bypass portion PE3 may be disposed on the bank layer BNL. The third bypass portion PE3 may be spaced apart from the first bypass portion PE1 of the first connection electrode CNE1 in the first direction DR1. The third connection portion BE3 may be disposed in the emission area EMA and connected to the third main portion ME3, the fourth main portion ME4, and the third bypass portion PE3. The third connection portion BE3 may be connected to a side of the third main portion ME3 and the fourth main portion ME4 disposed in the emission area EMA. The fourth connection portion BE4 may be disposed on a portion of the bank layer BNL extending in the second direction DR2, and may be connected to a portion of the fourth main portion ME4 disposed on the bank layer BNL, and the third bypass portion PE3. The third connection electrode CNE3 may include the fourth main portion ME4 that may be the outermost main portion, and may further include the third bypass portion PE3, the third connection portion BE3, and the fourth connection portion BE4 for preventing defects caused by the disconnection of the fourth main portion ME4. The third main portion ME3, the fourth main portion ME4, the third bypass portion PE3, the third connection portion BE3, and the fourth connection portion BE4 of the third connection electrode CNE3 may be integrally connected to each other, and may be electrically connected to a third contact portion CP3 to be described later.

The fourth connection electrode CNE4 may include a fourth bypass portion PE4 spaced apart from the fifth main portion ME5 in the second direction DR2, the fifth main portion ME5, a fifth connection portion BE5 connected to the sixth main portion MEG and the fourth bypass portion PE4, and a sixth connection portion BE6 connected to the fourth bypass portion PE4 and the sixth main portion MEG. The fourth bypass portion PE4 may be disposed on the bank layer BNL. The fourth bypass portion PE4 may be spaced apart from the first bypass portion PE1 of the first connection electrode CNE1 of another sub-pixel SPXn adjacent in the second direction DR2. The fifth connection portion BE5 may be disposed in the emission area EMA and connected to the fifth main portion ME5, the sixth main portion MEG, and the fourth bypass portion PE4. The fifth connection portion BE5 may be connected to a side of the fifth main portion ME5 and the sixth main portion MEG disposed in the emission area EMA. The sixth connection portion BE6 may be disposed on a portion of the bank layer BNL extending in the second direction DR2, and may be connected to a portion of the fourth main portion ME4 disposed on the bank layer BNL, and the fourth bypass portion PE4. The fourth connection electrode CNE4 may include the fifth main portion ME5 that may be the outermost main portion, and may further include the fourth bypass portion PE4, the fifth connection portion BE5, and the sixth connection portion BE6 for preventing defects caused by the disconnection of the fifth main portion ME5. The fifth main portion ME5, the sixth main portion MEG, the fourth bypass portion PE4, the fifth connection portion BE5, and the sixth connection portion BE6 of the fourth connection electrode CNE4 may be integrally connected to each other, and each of them may be electrically connected to a fourth contact portion CP4 to be described later.

The fifth connection electrode CNE5 may include a fifth bypass portion PE5 spaced apart from the eighth main portion ME8 in the second direction DR2, the seventh main portion ME7, a seventh connection portion BE7 connected to the eighth main portion ME8 and the fifth bypass portion PE5, and an eighth connection portion BE8 connected to the fifth bypass portion PE5 and the seventh main portion ME7. The fifth bypass portion PE5 may be disposed on the bank layer BNL. The fifth bypass portion PE5 may be spaced apart from the third bypass portion PE3 of the third connection electrode CNE3 of another sub-pixel SPXn adjacent in the second direction DR2, and may be spaced apart from the fourth bypass portion PE4 of the fourth connection electrode CNE4 of the corresponding sub-pixel SPXn in the first direction DR1. The seventh connection portion BE7 may be disposed on a portion of the bank layer BNL extending in the second direction DR2, and may be connected to portions of the seventh main portion MET and the eighth main portion ME8 disposed on the bank layer BNL, and the fifth bypass portion PE5. The eighth connection portion BE8 may be disposed in the emission area EMA and connected to the eighth main portion ME8 and the fifth bypass portion PE5. The eighth connection portion BE8 may be connected to a side of the eighth main portion ME8 disposed in the emission area EMA. The fifth connection electrode CNE5 may include the eighth main portion ME8 that may be the outermost main portion, and may further include the fifth bypass portion PE5, the seventh connection portion BE7, and the eighth connection portion BE8 for preventing defects caused by the disconnection of the eighth main portion ME8. The seventh main portion ME7, the eighth main portion ME8, the fifth bypass portion PE5, the seventh connection portion BE7, and the eighth connection portion BE8 of the fifth connection electrode CNE5 may be integrally connected to each other.

Some of the connection electrodes CNE may include the contact portions CP1, CP2, CP3, and CP4 disposed in the sub-region SA. The first connection electrode CNE1 may include the first contact portion CP1 disposed in the sub-region SA, and the first contact portion CP1 may be in contact with the first electrode RME1 through the first contact hole CT1 penetrating the first insulating layer PAS1, the second insulating layer PAS2, and the third insulating layer PAS3 in the sub-region SA. The second connection electrode CNE2 may include the second contact portion CP2 disposed in the sub-region SA, and the second contact portion CP2 may be in contact with the second electrode RME2 through the second contact hole CT2 penetrating the first insulating layer PAS1, the second insulating layer PAS2, and the third insulating layer PAS3 in the sub-region SA.

The third connection electrode CNE3 may include the third contact portion CP3 disposed in the sub-region SA, and the third contact portion CP3 may be in contact with the third electrode RME3 through the third contact hole CT3 penetrating the first insulating layer PAS1 and the second insulating layer PAS2 in the sub-region SA. The fourth connection electrode CNE4 may include the fourth contact portion CP4 disposed in the sub-region SA, and the fourth contact portion CP4 may be in contact with the fourth electrode RME4 through the fourth contact hole CT4 penetrating the first insulating layer PAS1 and the second insulating layer PAS2 in the sub-region SA. Unlike the first to fourth connection electrodes CNE1, CNE2, CNE3, and CNE4, the fifth connection electrode CNE5 may not include a contact portion.

The first main portion ME1 of the first connection electrode CNE1 and the second main portion ME2 of the second connection electrode CNE2 may be electrically connected to the first contact portion CP1 and the second contact portion CP2, respectively, so that it may be possible to transmit the electrical signal applied from the first electrode RME1 and the second electrode RME2 to the light emitting elements ED. The third main portion ME3 of the third connection electrode CNE3 and the fifth main portion ME5 of the fourth connection electrode CNE4 may be electrically connected to the third electrode RME3 and the fourth electrode RME4 through the third contact portion CP3 and the fifth contact portion CP5, respectively.

The third connection electrode CNE3 and the fourth connection electrode CNE4 may be connection electrodes of the first connection electrode layer disposed on the second insulating layer PAS2, and the first connection electrode CNE1, the second connection electrode CNE2, and the fifth connection electrode CNE5 may be connection electrodes of the second connection electrode layer disposed on the third insulating layer PAS3. The third insulating layer PAS3 may be disposed between the first connection electrode layer and the second connection electrode layer.

The third insulating layer PAS3 may be disposed in a structure similar to that of the above-described embodiment. The third insulating layer PAS3 may be disposed on the second insulating layer PAS2 except the region in which the second connection electrode layer may be disposed.

In accordance with an embodiment, the third insulating layer PAS3 may include contact holes CT1 and CT2. The contact holes CT1 and CT2 formed in the third insulating layer PAS3 may be disposed to overlap different electrodes RME, respectively. For example, the third insulating layer PAS3 may include the first contact hole CT1 disposed to overlap the first electrode RME1, and the second contact hole CT2 disposed to overlap the second electrode RME2. The first contact holes CT1 and the second contact holes CT2 may penetrate the third insulating layer PAS3 to partially expose the top surfaces of the first electrode RME1 and the second electrode RME2 thereunder.

The light emitting elements ED may be classified into different light emitting elements ED depending on the connection electrodes CNE to be in contact with both ends of the light emitting elements ED to correspond to the arrangement structure of the connection electrodes CNE. The first light emitting element ED1 may be disposed on the first electrode RME1 and the third electrode RME3 to be in contact with the first connection electrode CNE1 and the third connection electrode CNE3, and the second light emitting element ED2 may be disposed on the second electrode RME2 and the fourth electrode RME4 to be in contact with the second connection electrode CNE2 and the fourth connection electrode CNE4. The third light emitting element ED3 may be disposed on the first electrode RME1 and the third electrode RME3 to be in contact with the third connection electrode CNE3 and the fifth connection electrode CNE5, and the fourth light emitting element ED4 may be disposed on the second electrode RME2 and the fourth electrode RME4 to be in contact with the fourth connection electrode CNE4 and the fifth connection electrode CNE5.

For example, the first light emitting element ED1 may have a first end in contact with the first main portion ME1 and a second end in contact with the third main portion ME3, and the second light emitting element ED2 may have a first end in contact with the fifth main portion ME5 and a second end in contact with the second main portion ME2. The third light emitting element ED3 may have a first end in contact with the fourth main portion ME4 and a second end in contact with the seventh main portion ME7, and the fourth light emitting element ED4 may have a first end in contact with the eighth main portion ME8 and a second end in contact with the sixth main portion MEG. The light emitting elements ED may be connected in series through the connection electrodes CNE. Since the display device 10 according to an embodiment includes a larger number of light emitting elements ED for each sub-pixel SPXn and the light emitting elements ED may be connected in series, the light emission amount per unit area may be further increased. Further, in the display device 10_1, at least some of the connection electrodes CNE may include the bypass portions and the connection portions respectively electrically connected to the main portion in contact with the light emitting element ED and the contact portions in contact with the electrode RME, so that it may be possible to prevent defects caused by disconnection of the main portion. In the display device 10_1, the number of light emitting elements ED remaining as non-emission elements in each sub-pixel SPXn may be reduced, so that it may be possible to prevent occurrence of dark spots in the sub-pixel SPXn and poor light emission amount.

Figure 15:
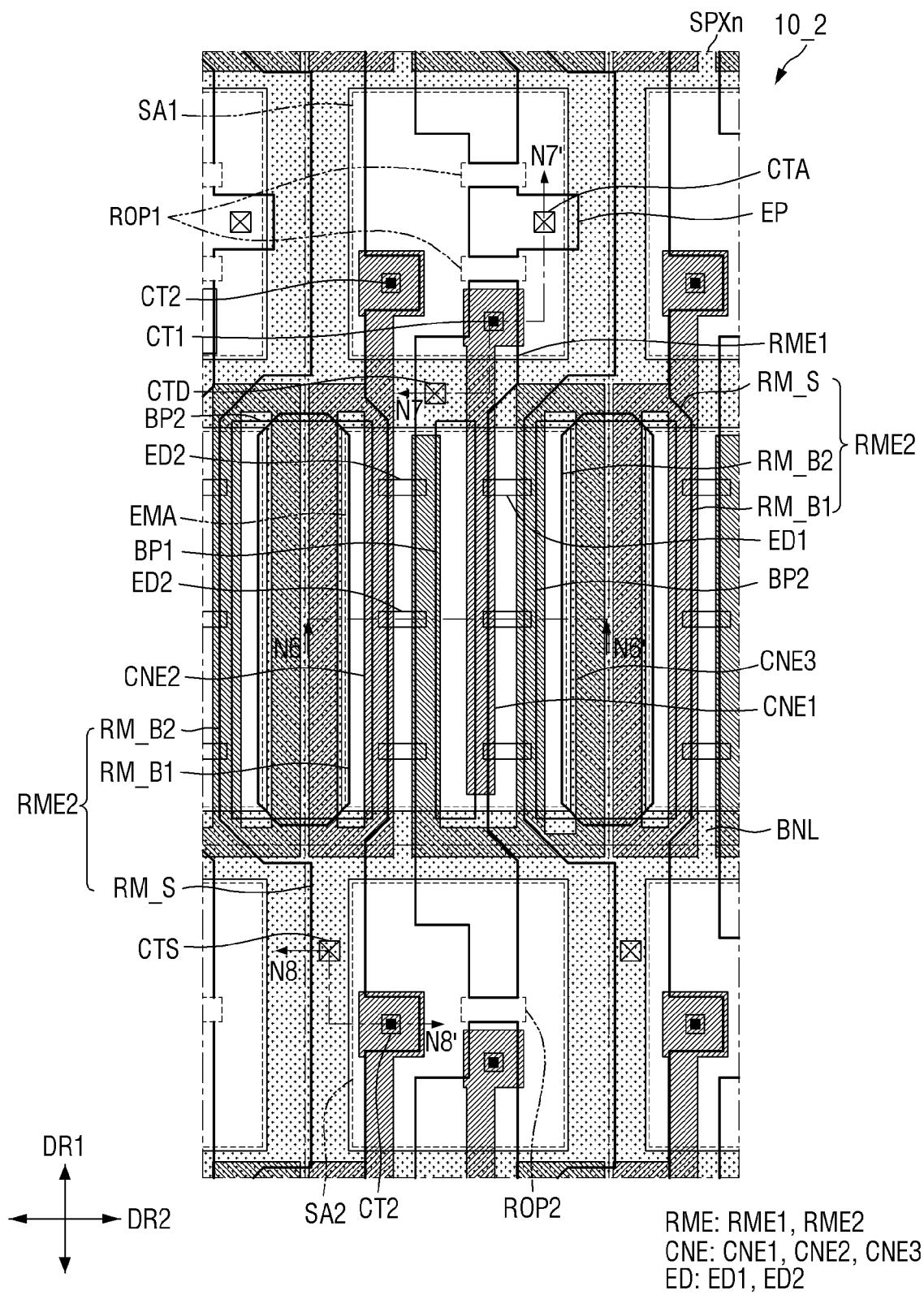
FIG. 15 is a schematic plan view illustrating a sub-pixel of a display device according to still another embodiment.
Figure 16:
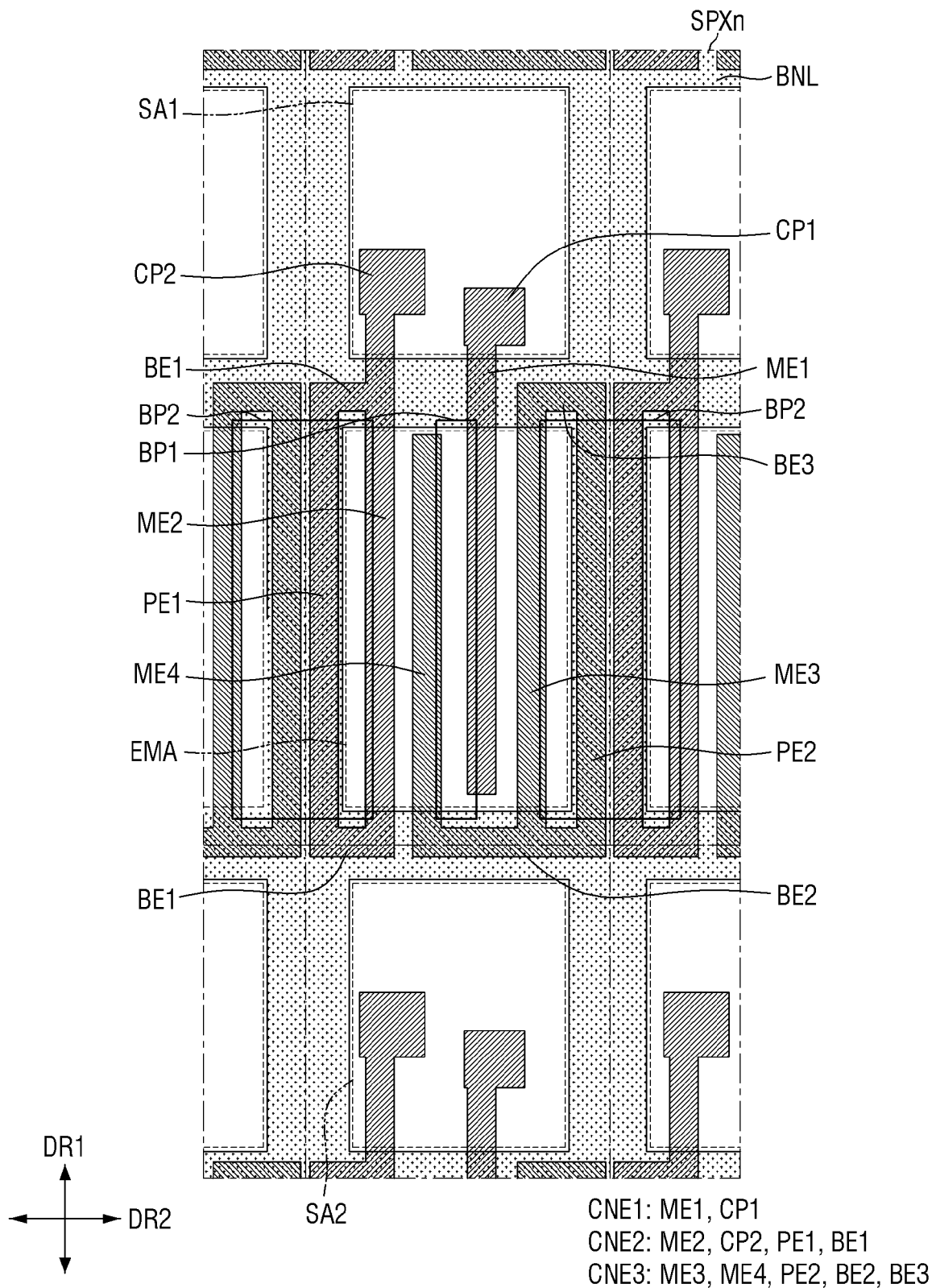
FIG. 16 is a schematic plan view illustrating connection electrodes disposed in a sub-pixel of FIG. 15.
Figure 17:
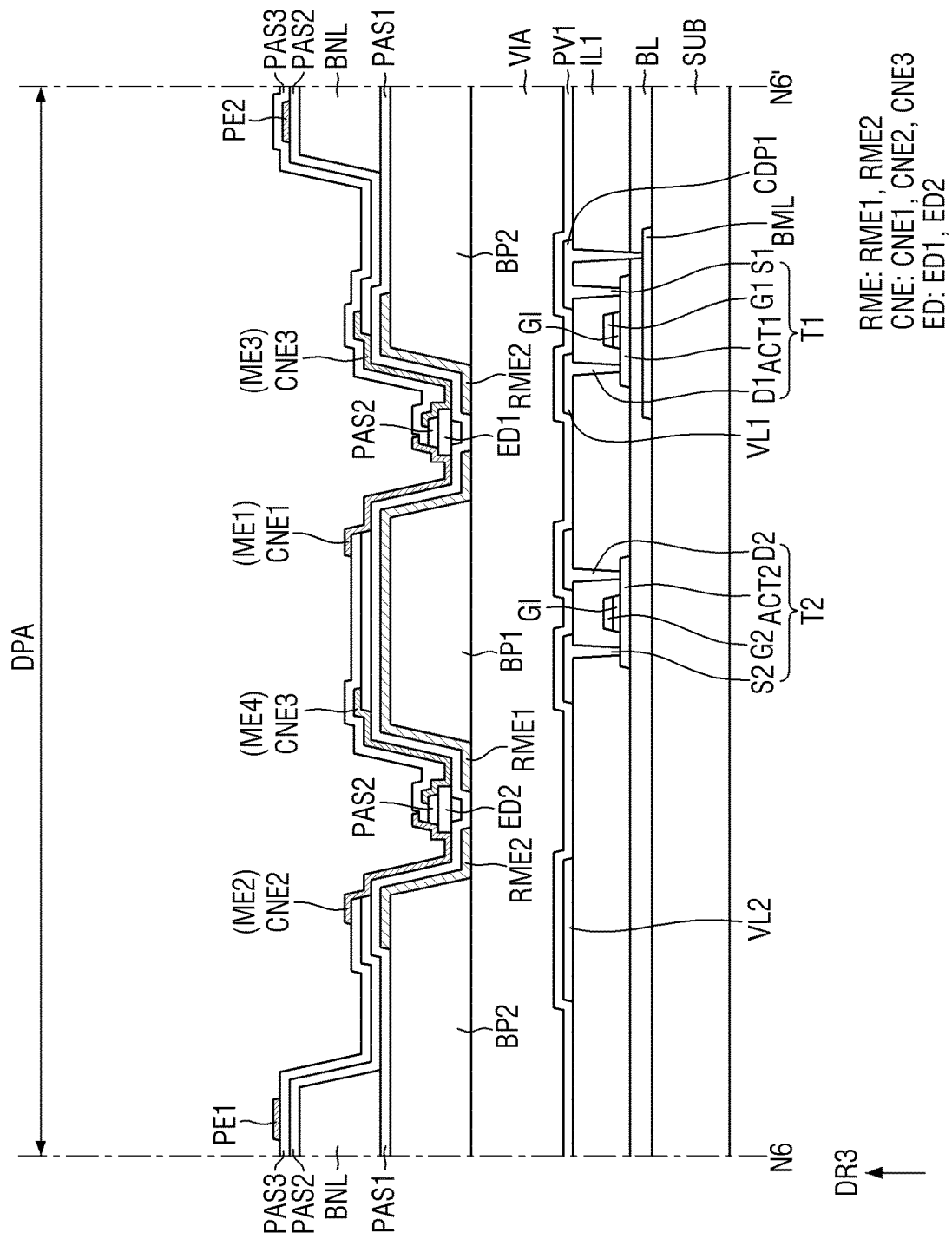
FIG. 17 is a schematic cross-sectional view taken along line N6-N6' of FIG. 15.
Figure 18:
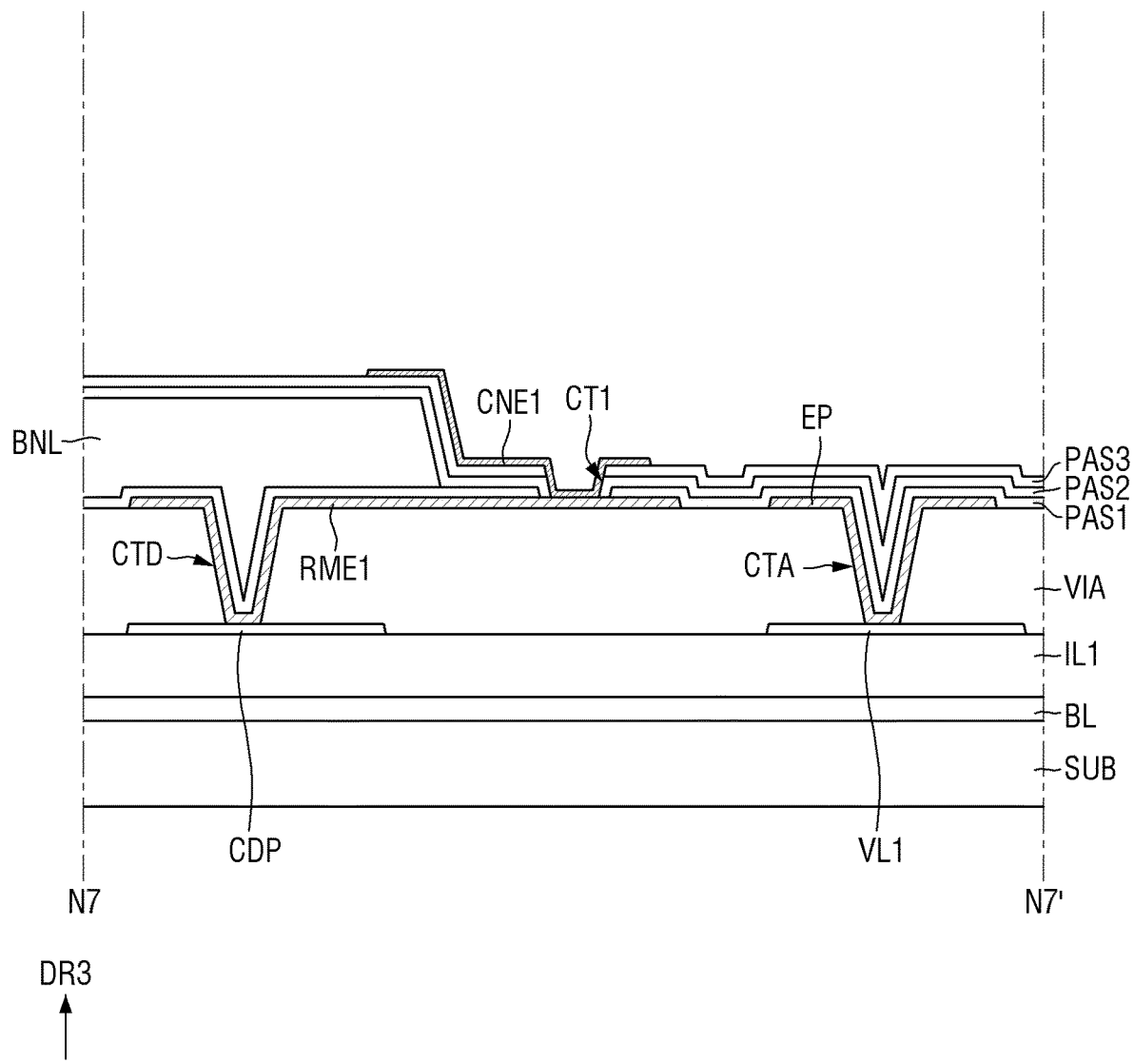
FIG. 18 is a schematic cross-sectional view taken along line N7-N7' in FIG. 15.
Figure 19:
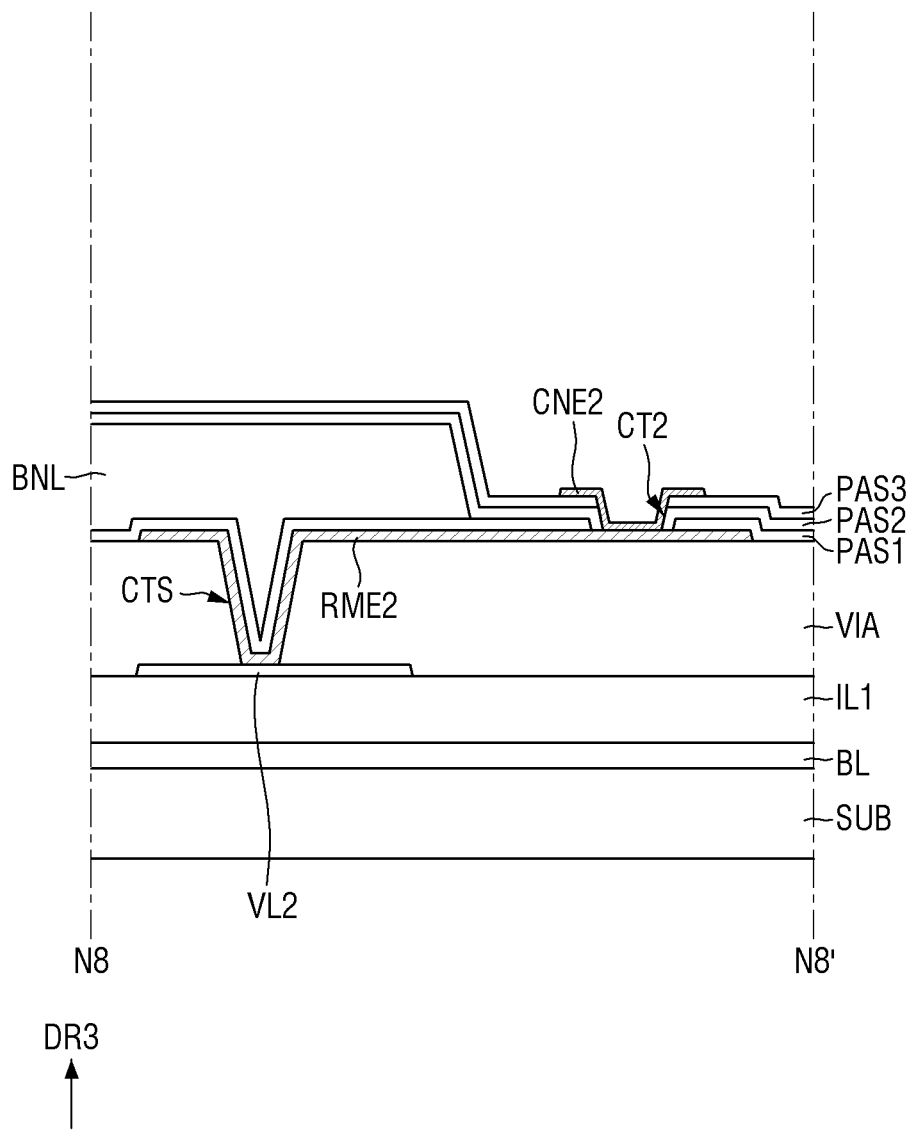
FIG. 19 is a schematic cross-sectional view taken along line N8-N8' of FIG. 15.

FIG. 15 is a schematic plan view illustrating a sub-pixel of a display device according to still another embodiment. FIG. 16 is a schematic plan view illustrating connection electrodes disposed in a sub-pixel of FIG. 15. FIG. 17 is a schematic cross-sectional view taken along line N6-N6' of FIG. 15. FIG. 18 is a schematic cross-sectional view taken along line N7-N7' in FIG. 15. FIG. 19 is a schematic cross-sectional view taken along line N8-N8' of FIG. 15.

FIG. 15 illustrates planar arrangement of the electrodes RME (RME1 and RME2), the bank patterns BP1 and BP2, the bank layer BNL, the light emitting elements ED (ED1 and ED2), and the connection electrodes CNE (CNE1, CNE2, and CNE3) disposed in a sub-pixel PXn of the display device 10_2. FIG. 16 illustrates planar arrangement of the bank patterns BP1 and BP2, the bank layer BNL, the light emitting elements ED, and the connection electrodes CNE (CNE1, CNE2, and CNE3) disposed in a sub-pixel PXn of the display device 10_2. FIG. 17 illustrates a cross section across both ends of the first light emitting element ED1 and the second light emitting element ED2 disposed in a sub-pixel SPXn, and FIGS. 18 and 19 illustrate a cross section across the electrode contact holes CTD, CTS, and CTA and the contact holes CT1 and CT2.

Referring to FIGS. 15 to 19, the display device 10_2 according to an embodiment may be different from those of the above-described embodiments in the structures of the electrode RME, the connection electrode CNE, and the bank patterns BP1 and BP2. Hereinafter, the redundant description of the above-described embodiments will be omitted while focusing on differences.

The bank patterns BP1 and BP2 may have a shape extending in the first direction DR1, and may have different widths measured in the second direction DR2. Any one of the bank patterns BP1 and BP2 may be disposed across the sub-pixels SPXn adjacent in the second direction DR2. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn.

The first bank pattern BP1 may be disposed in the center of the emission areas EMA, and the second bank patterns BP2 may be disposed to be spaced apart from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that may be spaced apart from each other.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The first bank pattern BP1 may be disposed to overlap the first electrode RME1, and the second bank pattern BP2 may be disposed to overlap electrode branch portions RM_B1 and RM_B2 of the second electrode RME2 and the bank layer BNL.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The bank patterns BP1 and BP2 may be disposed in an island-like pattern on the entire surface of the display area DPA.

The electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first bank pattern BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched near the emission area EMA. In an embodiment, the second electrode RME2 may include an electrode stem portion RM_S extending in the first direction DR1, the electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at a side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. For example, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in a sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap a side of the second bank pattern BP2. The first electrode branch portion RM_B1 may partially overlap the second bank pattern BP2 disposed on the left side of the first bank pattern BP1, and the second electrode branch portion RM_B2 may partially overlap the second bank pattern BP2 disposed on the right side of the first bank pattern BP1. Both sides of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first bank pattern BP1 and overlap both sides of the first bank pattern BP1, whereas the second electrode RME2 may have a relatively small width so that the electrode branch portions RM_B1 and RM_B2 may overlap only a side of the second bank pattern BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may be disposed to overlap the first contact hole CT1. The second electrode RME2 may have a portion that protrudes from the electrode stem portion RM_S in the second direction DR2 to be disposed in the sub-region SA, and the second electrode RME2 may overlap the second contact hole CT2 at the protruding part.

Between the first electrode RME1 and the second electrode RME2, the first electrode RME1 may extend to separation portions ROP1 and ROP2 of the sub-region SA, whereas the second electrode RME2 may not be separated in the sub-region SA. A second electrode RME2 may include electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with an embodiment, the display device 10 may include a wire connection electrode EP disposed between the first electrodes RME1 of different sub-pixels SPXn in the first sub-region SA1 among the sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced apart from each other. In the sub-pixel SPXn illustrated in FIG. 15 among the sub-pixels SPXn, the first sub-region SA1 in which the wire connection electrode EP may be disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 27 in the first direction DR1, the first sub-region SA1 in which the wire connection electrode EP may be disposed may be disposed on the lower side of the emission area EMA, and the second sub-region SA2 may be disposed on the upper side of the emission area EMA.

The first electrode RME1 may be spaced apart from the wire connection electrode EP with the first separation part ROP1 interposed therebetween in the first sub-region SA1. Two first separation portions ROP1 may be disposed in one first sub-region SA1. The wire connection electrode EP may be spaced apart from the first electrode RME1 disposed in the corresponding sub-pixel SPXn with a lower first separation portion ROP1 interposed therebetween, and may be spaced apart from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced apart from each other in the first direction DR1.

In an embodiment, the wire connection electrode EP may be connected to the first voltage line VL1 of the third conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

A relative arrangement of the second electrode contact hole CTS may be different from that of the third electrode contact hole CTA to be described later. The second electrode contact hole CTS may be disposed at the portion of the bank layer BNL surrounding the second sub-region SA2, and the third electrode contact hole CTA may be disposed in the first sub-region SA1. Since the second electrode contact hole CTS and the third electrode contact hole CTA expose the top surfaces of different voltage lines VL1 and VL2, respectively, the positions of the electrode contact holes may be determined to correspond thereto.

The bank layer BNL may surround the emission area EMA and the sub-regions SA1 and SA2 similarly to the above-described embodiment. However, in an embodiment in which the display device 10 includes the sub-regions SA1 and SA2 distinguished from each other, the areas surrounded by the bank layer BNL may be distinguished from each other. The bank layer BNL may be the same as that in the above-described embodiment except that it surrounds different sub-regions SA1 and SA2.

The light emitting elements ED may be disposed on different electrodes RME between different bank patterns BP1 and BP2. The light emitting elements ED may include the first light emitting element EL1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1, CNE2, and CNE3) may include a first connection electrode CNE1, a second connection electrode CNE2, and a third connection electrode CNE3. Each of the connection electrodes CNE1, CNE2, and CNE3 may include at least one main portion MEL ME2, ME3, and ME4 to be in contact with the light emitting element ED. Some of the connection electrodes CNE1, CNE2, and CNE3 may include the contact portions CP1 and CP2 to be in contact with the electrodes RME1 and RME2, and some others thereof may include the bypass portions PE1 and PE2 and the connection portions BEL BE2, and BE3.

The first connection electrode CNE1 may include the first main portion ME1 having a shape extending in the first direction DR1 and disposed on the first electrode RME1. A portion of the first main portion ME1 disposed on the first bank pattern BP1 may overlap the first electrode RME1, extend in the first direction DR1 therefrom to cross the bank layer BNL, and be disposed up to the first sub-region SA1 positioned on the upper side of the emission area EMA. The first connection electrode CNE1 may include the first contact portion CP1 in contact with the first electrode RME1 through the first contact hole CT1 in the first sub-region SA1, and the first contact portion CP1 and the first main portion ME1 may be electrically connected to each other. For example, the first main portion ME1 may be integrally connected to the first contact portion CP1.

The second connection electrode CNE2 may include the second main portion ME2 having a shape extending in the first direction DR1 and disposed on the second electrode RME2. A portion of the second main portion ME2 disposed on the second bank pattern BP2 may overlap the second electrode RME2, extend in the first direction DR1 therefrom to cross the bank layer BNL, and be disposed up to the first sub-region SA1 positioned on the upper side of the emission area EMA. The second connection electrode CNE2 may include the second contact portion CP2 in contact with the second electrode RME2 through the second contact hole CT2 in the first sub-region SA1, and the second contact portion CP2 and the second main portion ME2 may be electrically connected to each other. For example, the second main portion ME2 may be integrally connected to the second contact portion CP2.

In the sub-pixel SPXn adjacent to the sub-pixel SPXn of FIG. 15 in the first direction DR1, the first connection electrode CNE1 and the second connection electrode CNE2 may be in contact with the first electrode RME1 and the second electrode RME2 through the contact holes CT1 and CT2 disposed in the second sub-region SA2, respectively.

The third connection electrode CNE3 may include the third main portion ME3 and the fourth main portion ME4. The third main portion ME3 may be disposed on the second electrode branch portion RM_B2 of the second electrode RME2 while facing the first main portion ME1 of the first connection electrode CNE1 in the emission area EMA, and the fourth main portion ME4 may be disposed on the first electrode RME1 while facing the second main portion ME2 of the second connection electrode CNE2 in the emission area EMA.

As described above with reference to an embodiment of FIGS. 11 to 14, the main portions ME1 to ME4 of the connection electrodes CNE1, CNE2, and CNE3 may be classified into the outermost main portions ME2 and ME3 and the inner main portions ME1 and ME4. The second main portion ME2 and the third main portion ME3 disposed on the second electrode RME2 may be the outermost main portions, and the first main portion ME1 and the fourth main portion ME4 disposed on the first electrode RME1 may be the inner main portions.

In accordance with an embodiment, some of the connection electrodes CNE may include the connection portions BE1 to BE3 and the bypass portions PE1 and PE2 connected to the main portions ME1 to ME4 in order to prevent non-emission failure of the light emitting element ED caused by the disconnection of the main portions ME1 to ME4. Further, some connection electrodes CNE may include two or more main portions and a connection portion connecting them.

The second connection electrode CNE2 may include the first bypass portion PE1 spaced apart from the second main portion ME2 in the second direction DR2, and the first connection portions BE1 connected to the first bypass portion PE1 and the second main portion ME2. The first bypass portion PE1 may be disposed on the bank layer BNL. The first connection portions BE1 may be disposed on a portion of the bank layer BNL extending in the second direction DR2, and may be connected to a portion of the second main portion ME2 disposed on the bank layer BNL, and the first bypass portion PE1. The second connection electrode CNE2 may include the second main portion ME2 that may be the outermost main portion, and may further include the first bypass portion PE1 and the first connection portion BE1 for preventing defects caused by the disconnection of the second main portion ME2. The second main portion ME2, the first bypass portion PE1, and the first connection portion BE1 of the second connection electrode CNE2 may be integrally connected to each other, and each of them may be electrically connected to the second contact portion CP2.

The third connection electrode CNE3 may include the second bypass portion PE2 spaced apart from the third main portion ME3 in the second direction DR2, the third main portion ME3, the second connection portion BE2 connected to the fourth main portion ME4 and the second bypass portion PE2, and the third connection portion BE3 connected to the second bypass portion PE2 and the third main portion ME3. The second bypass portion PE2 may be disposed on the bank layer BNL. The second bypass portion PE2 may be spaced apart from the first bypass portion PE1 of the second connection electrode CNE2 in the second direction DR2. Each of the second connection portion BE2 and the third connection portion BE3 may be disposed on a portion of the bank layer BNL extending in the second direction DR2. The second connection portion BE2 may be connected to the third main portion ME3, the fourth main portion ME4, and the second bypass portion PE2. The second connection portion BE2 may be disposed on the lower side of the emission area EMA and connected to each of the third main portion ME3 and the fourth main portion ME4. The third connection portion BE3 may be disposed on the upper side of the emission area EMA and connected to a portion of the third main portion ME3 disposed on the bank layer BNL and the second bypass portion PE2. The third connection electrode CNE3 may include the third main portion ME3 that may be the outermost main portion, and may further include the second bypass portion PE2, the second connection portion BE2, and the third connection portion BE3 for preventing defects caused by to disconnection of the third main portion ME3. The third main portion ME3, the fourth main portion ME4, the second bypass portion PE2, the second connection portion BE2, and the third connection portion BE3 of the third connection electrode CNE3 may be integrally connected to each other.

The first light emitting element ED1 may have a first end in contact with the first main portion ME1 of the first connection electrode CNE1 and a second end in contact with the third main portion ME3 of the third connection electrode CNE3. The second light emitting element ED2 may have a first end in contact with the fourth main portion ME4 of the third connection electrode CNE3 and a second end in contact with the second main portion ME2 of the second connection electrode CNE2. The first end of the first light emitting element ED1 and the second end of the second light emitting element ED2 may be electrically connected to the first connection electrode CNE1 and the second connection electrode CNE2, respectively, so that an electrical signal may be received from the electrode RME, and the second end of the first light emitting element ED1 and the first end of the second light emitting element ED2 may be electrically connected to the third connection electrode CNE3 in series.

Figure 20:
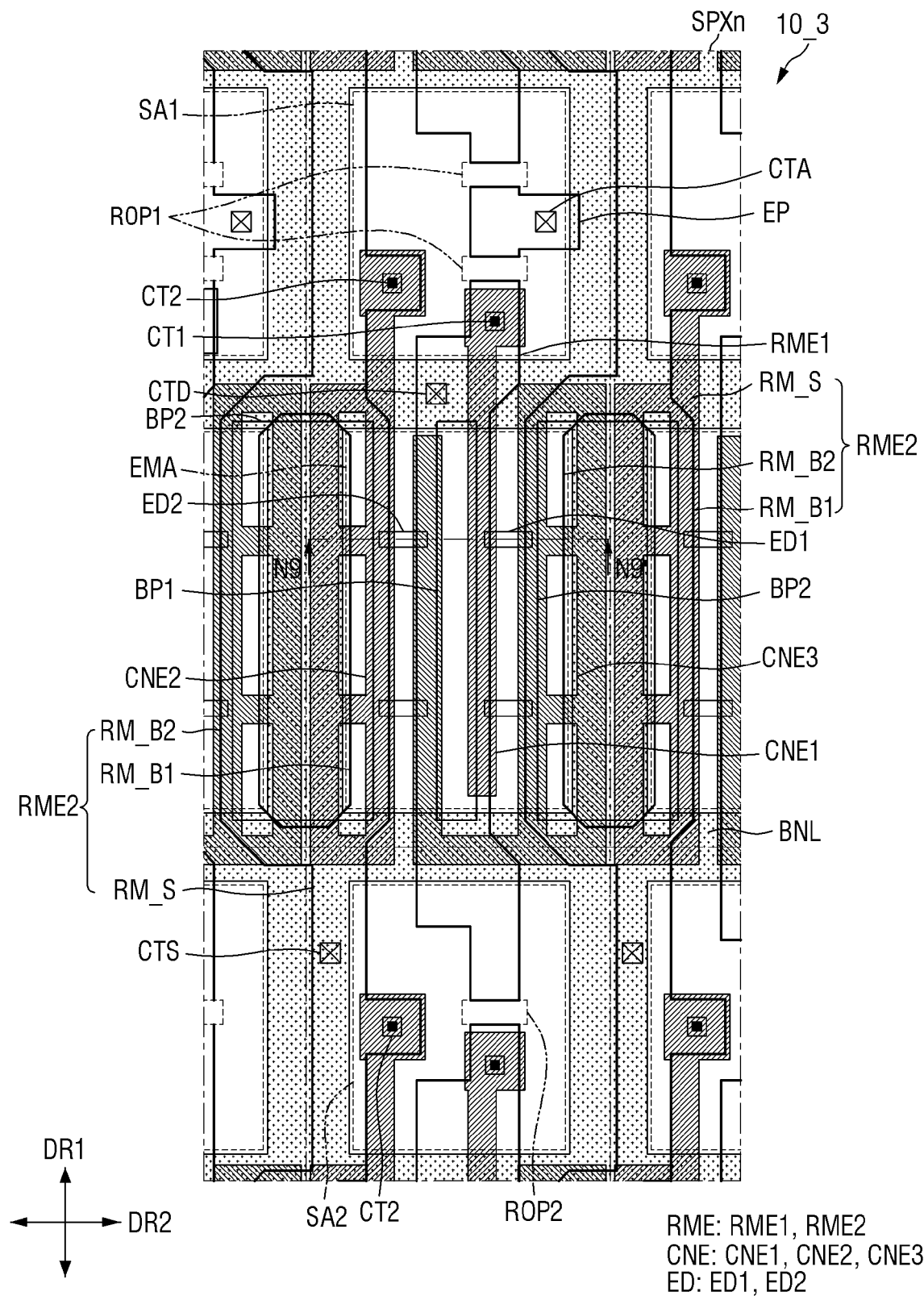
FIG. 20 is a schematic plan view illustrating connection electrodes disposed in a sub-pixel of a display device according to another embodiment.
Figure 21:
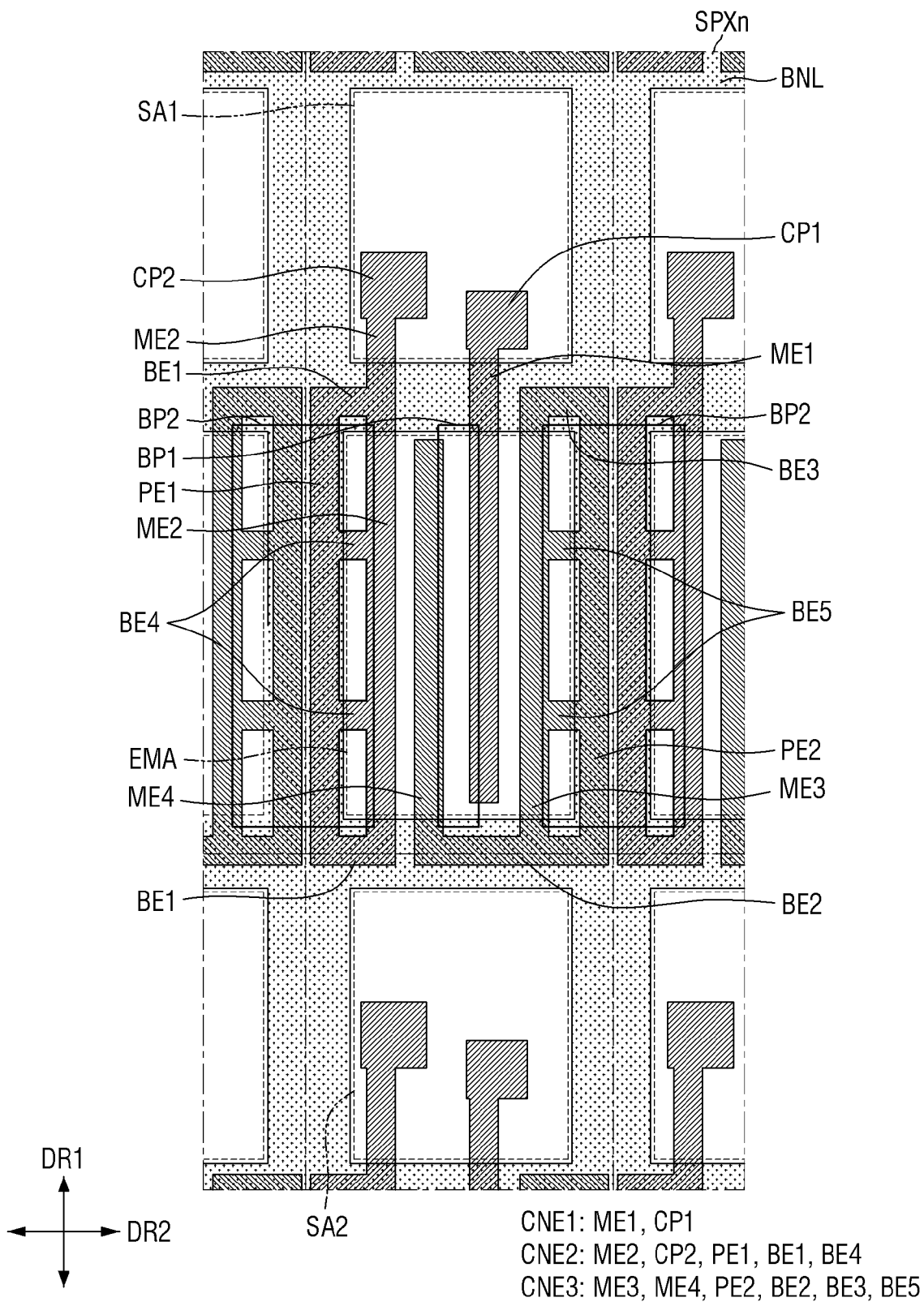
FIG. 21 is a schematic plan view illustrating connection electrodes disposed in a sub-pixel of FIG. 20.
Figure 22:
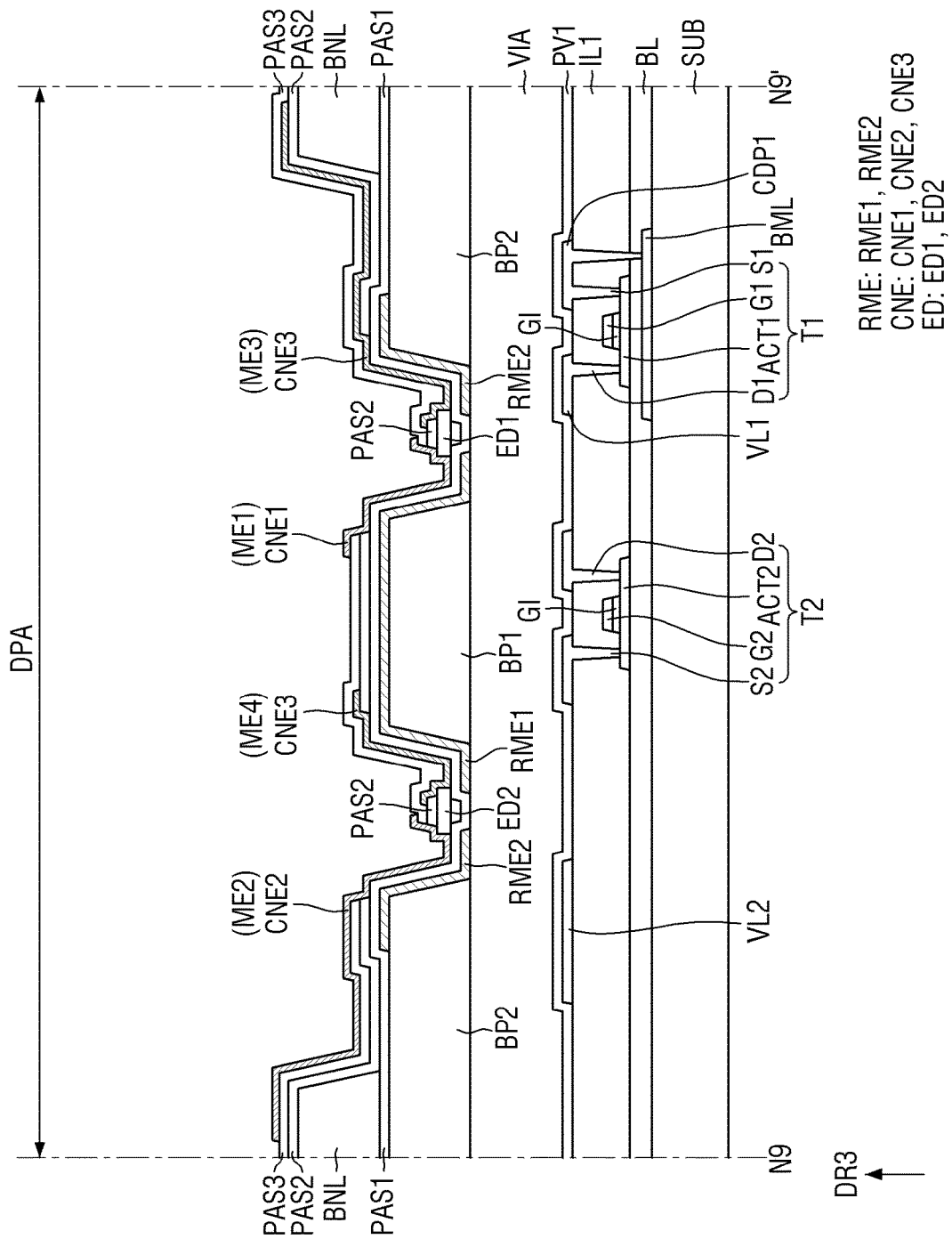
FIG. 22 is a schematic cross-sectional view taken along line N9-N9' in FIG. 20.

FIG. 20 is a schematic plan view illustrating connection electrodes disposed in a sub-pixel of a display device according to another embodiment. FIG. 21 is a schematic plan view illustrating connection electrodes disposed in a sub-pixel of FIG. 20. FIG. 22 is a schematic cross-sectional view taken along line N9-N9' in FIG. 20.

Referring to FIGS. 20 to 22, in a display device 10_3 according to an embodiment, the connection electrodes CNE2 and CNE3 including the bypass portions PE1 and PE2 among the connection electrodes CNE may include a larger number of connection portions BE4 and BE5. An embodiment may be different from an embodiment of FIGS. 15 to 19 at least in that some of the connection electrodes CNE2 and CNE3 further include additional connection portions BE4 and BE5. In the following description, redundant description will be omitted while focusing on differences.

The second connection electrode CNE2 may further include fourth connection portions BE4 in addition to the second main portion ME2, the first bypass portion PE1, and the first connection portions BE1. The fourth connection portions BE4 may be connected to the second main portion ME2 and the first bypass portion PE1 while extending in the second direction DR2. The fourth connection portions BE4 may be disposed between the first connection portions BE1 to be spaced apart therefrom. However, unlike the first connection portions BE1, the fourth connection portions BE4 may not overlap at least a part of the bank layer BNL, and the non-overlapping portion may be disposed in the emission area EMA.

Similarly, the third connection electrode CNE3 may further include fifth connection portions BE5 in addition to the third main portion ME3, the fourth main portion ME4, the second bypass portion PE2, the second connection portion BE2, and the third connection portions BE3. The fifth connection portions BE5 may be connected to the third main portion ME3 and the second bypass portion PE2 while extending in the second direction DR2. The fifth connection portions BE5 may be disposed between the second connection portion BE2 and the third connection portion BE3 to be spaced apart therefrom. However, unlike the second connection portion BE2 and the third connection portion BE3, the fifth connection portions BE5 may not overlap at least a part of the bank layer BNL, and the non-overlapping portion may be disposed in the emission area EMA.

As described above, in case that the light emitting elements ED are disposed in an aggregated state between the bank patterns BP1 and BP2 and on the electrodes RME, the main portions MEL ME2, ME3, and ME4 of the connection electrode CNE may be disconnected. In case that the light emitting elements ED are aggregated at multiple portions between the bank patterns BP1 and BP2, the number of portions in which the main portions MEL ME2, ME3 and ME4 may be disconnected may increase. In case that the connection electrodes CNE include a larger number of connection portions BE1 to BE5 to correspond thereto, even if the number of portions in which the main portions MEL ME2, ME3, and ME4 may be disconnected may be large, the number of light emitting elements ED remaining non-emission elements may be reduced, and emission failure of the pixel PX may be prevented.

Figure 23:
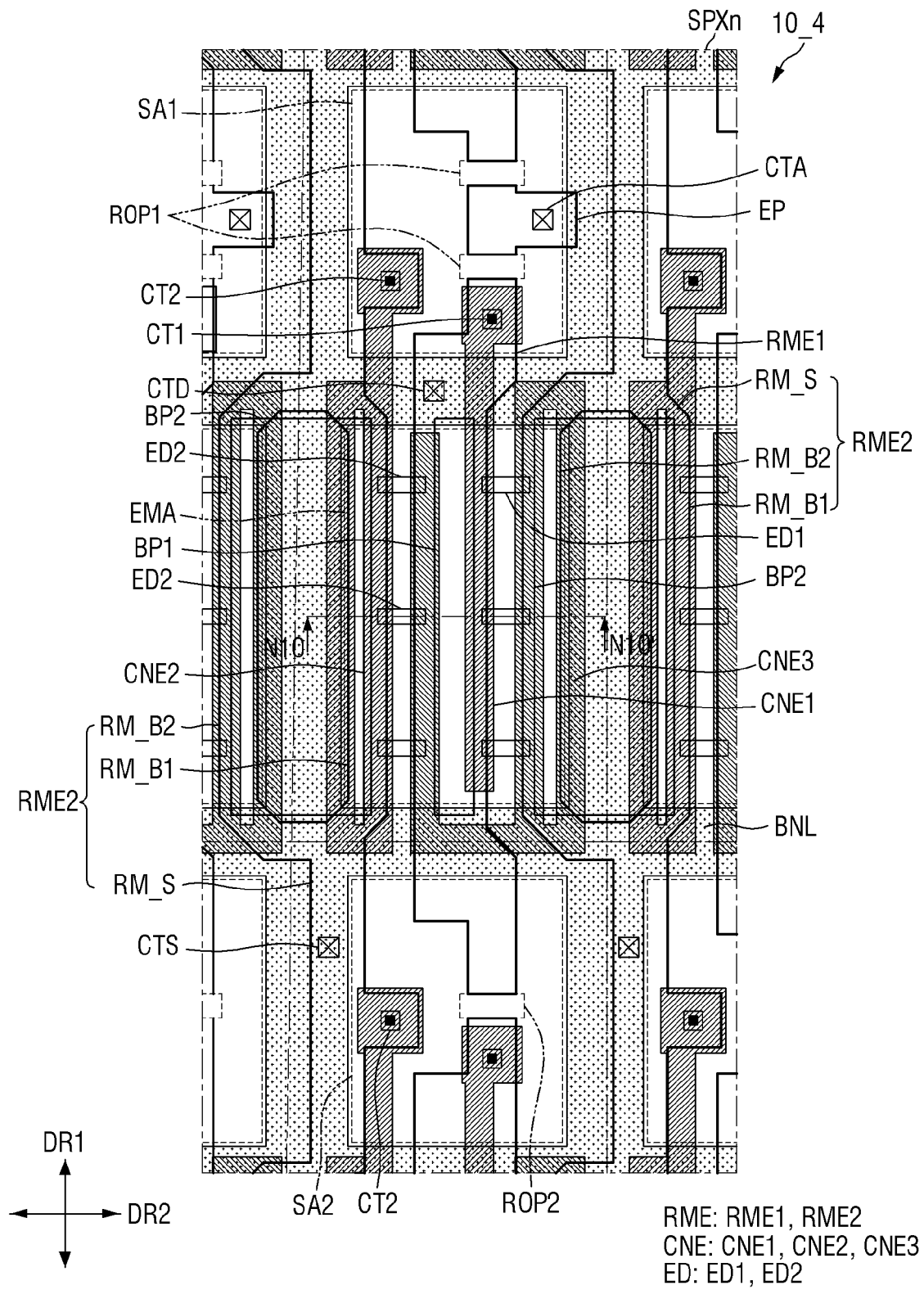
FIG. 23 is a schematic plan view illustrating connection electrodes disposed in a sub-pixel of a display device according to another embodiment.
Figure 24:
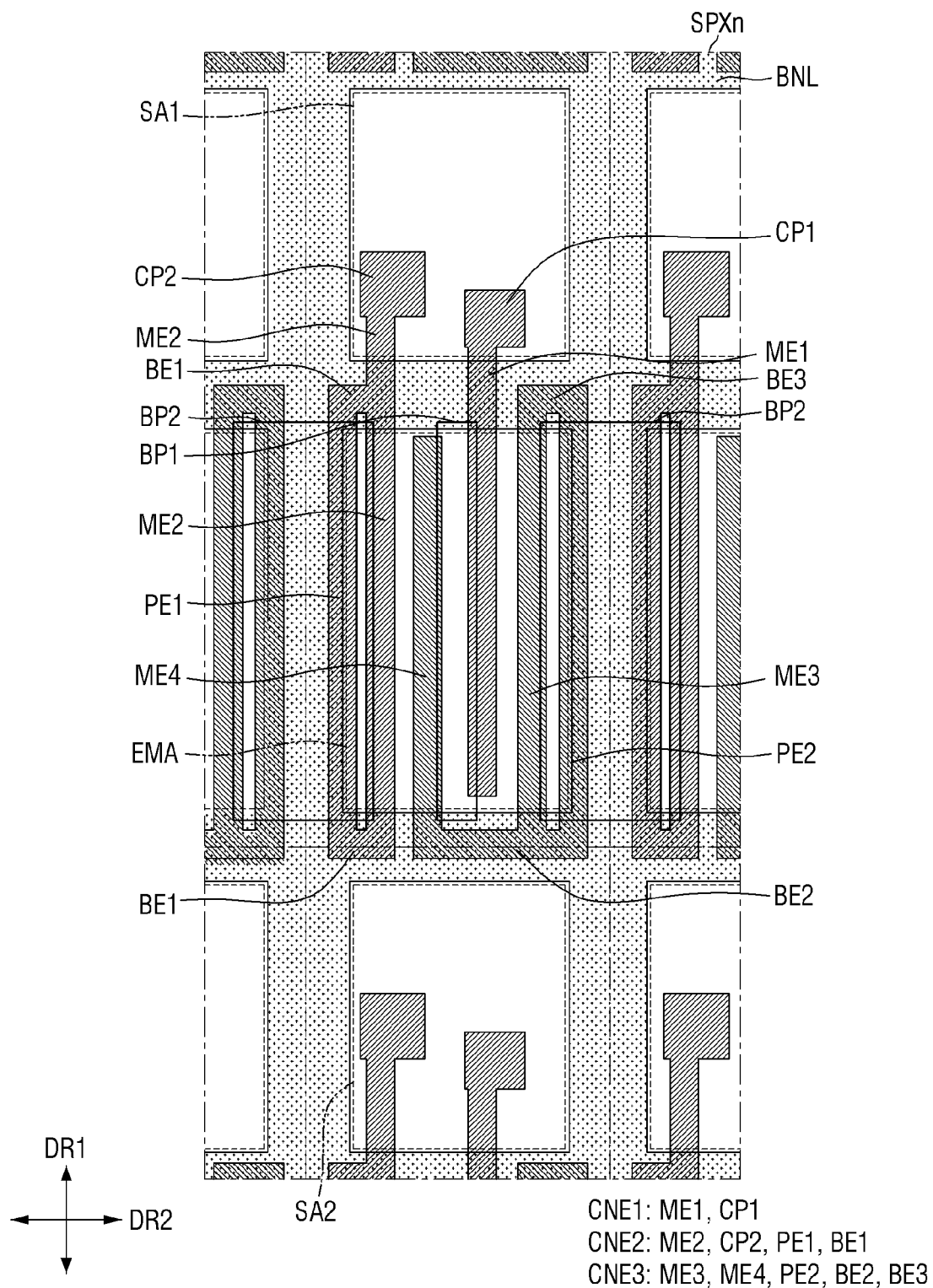
FIG. 24 is a schematic plan view illustrating connection electrodes disposed in a sub-pixel of FIG. 23.
Figure 25:
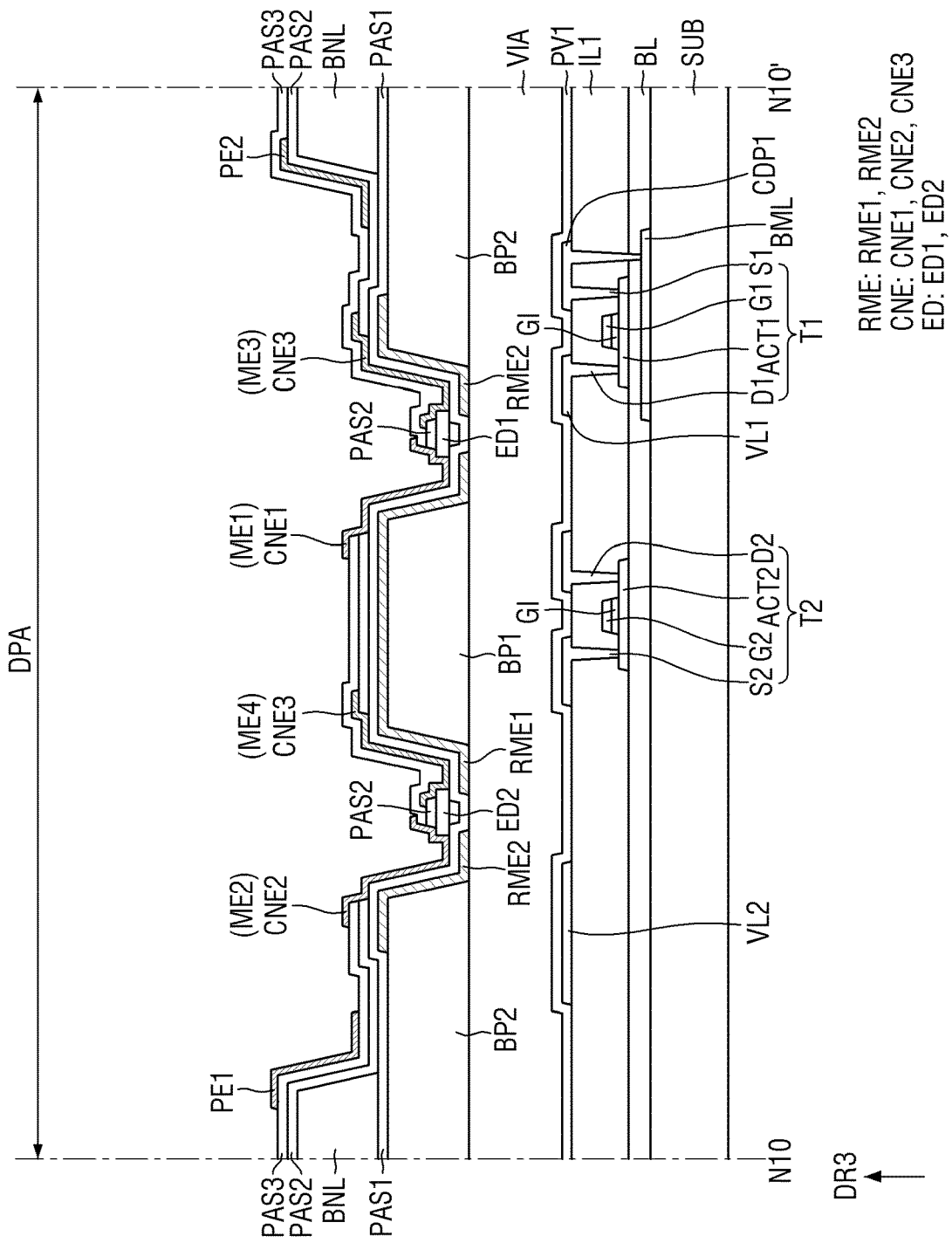
FIG. 25 is a schematic cross-sectional view taken along line N10-N10' in FIG. 23.

FIG. 23 is a schematic plan view illustrating connection electrodes disposed in a sub-pixel of a display device according to another embodiment. FIG. 24 is a schematic plan view illustrating connection electrodes disposed in a sub-pixel of FIG. 23. FIG. 25 is a schematic cross-sectional view taken along line N10-N10' in FIG. 23.

Referring to FIGS. 23 to 25, in a display device 10_4 according to an embodiment, in the connection electrodes CNE2 and CNE3 including the bypass portions PE1 and PE2 among the connection electrodes CNE, the gap between the bypass portions PE1 and PE2 and the main portions ME2 and ME3 may be relatively small. An embodiment may be different from an embodiment of FIGS. 15 to 19 at least in that the bypass portions PE1 and PE2 of the connection electrodes CNE2 and CNE3 may be partially disposed in the emission area EMA. In the following description, redundant description will be omitted while focusing on differences.

In accordance with an embodiment, the bypass portions PE1 and PE2 of the connection electrodes CNE may be disposed across the emission area EMA and the bank layer BNL. Some of the bypass portions PE1 and PE2 may be disposed to overlap the bank layer BNL, and some others thereof may be disposed so as not to overlap the bank layer BNL. The gap between the main portions MEL ME2, ME3, and ME4 and the bypass portions PE1 and PE2 of the connection electrode CNE may be relatively small. In the display device 10_4, the connection electrode CNE may further include the bypass portions PE1 and PE2 in addition to the main portions MEL ME2, ME3 and ME4, so that an area for arranging the connection electrodes CNE per unit area of the sub-pixel SPXn may be required. Since, however, the bypass portions PE1 and PE2 may be disposed across the bank layer BNL and the emission area EMA, an area for arranging the main portions MEL ME2, ME3, and ME4 and the bypass portions PE1 and PE2 of the connection electrode CNE may be reduced. Accordingly, the display device 10_4 according to an embodiment includes a large number of pixels PX and sub-pixels SPXn per unit area, and thus may be advantageous in realizing an ultra-high resolution display device.

Figure 26:
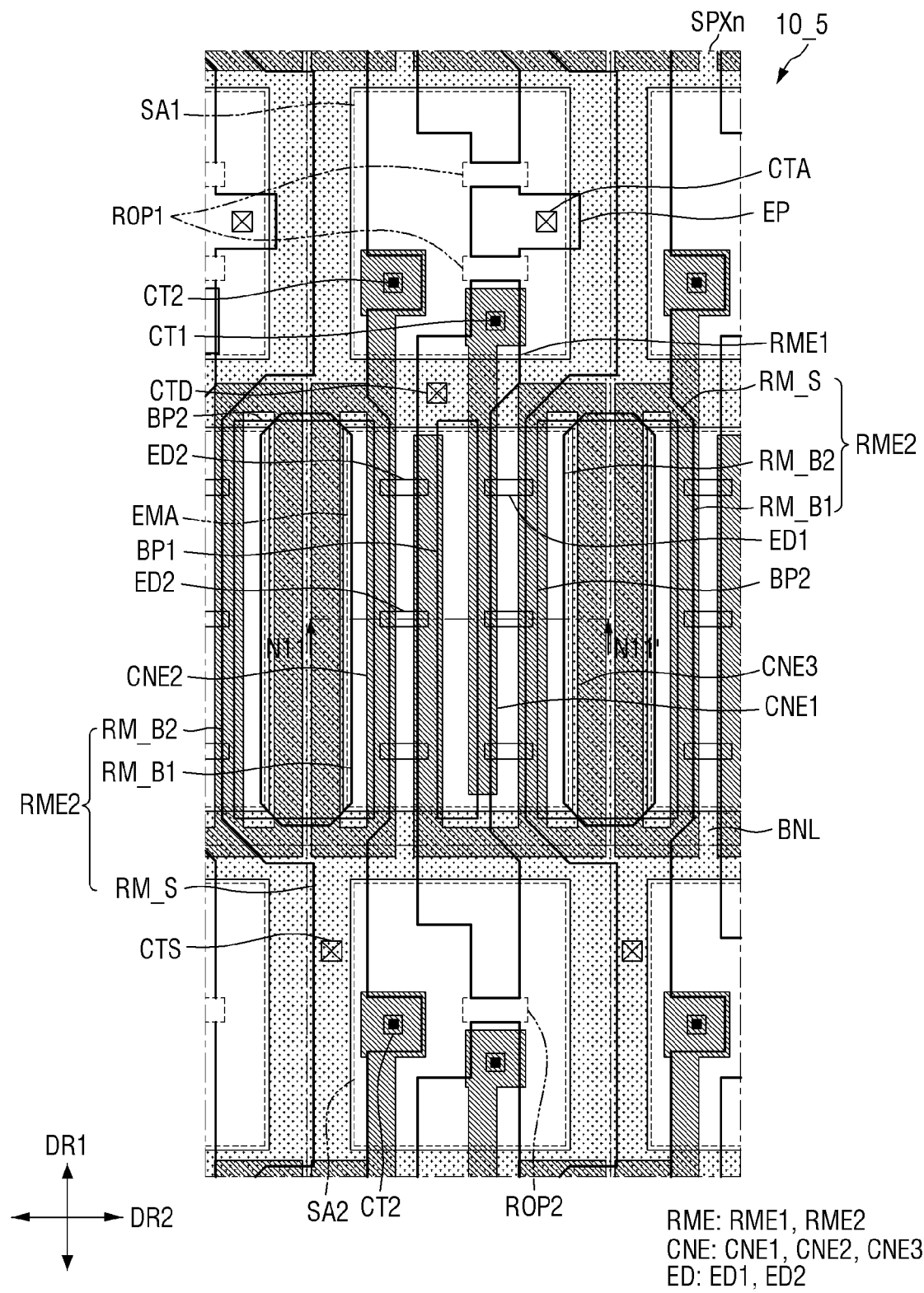
FIG. 26 is a schematic plan view illustrating connection electrodes disposed in a sub-pixel of a display device according to another embodiment.
Figure 27:
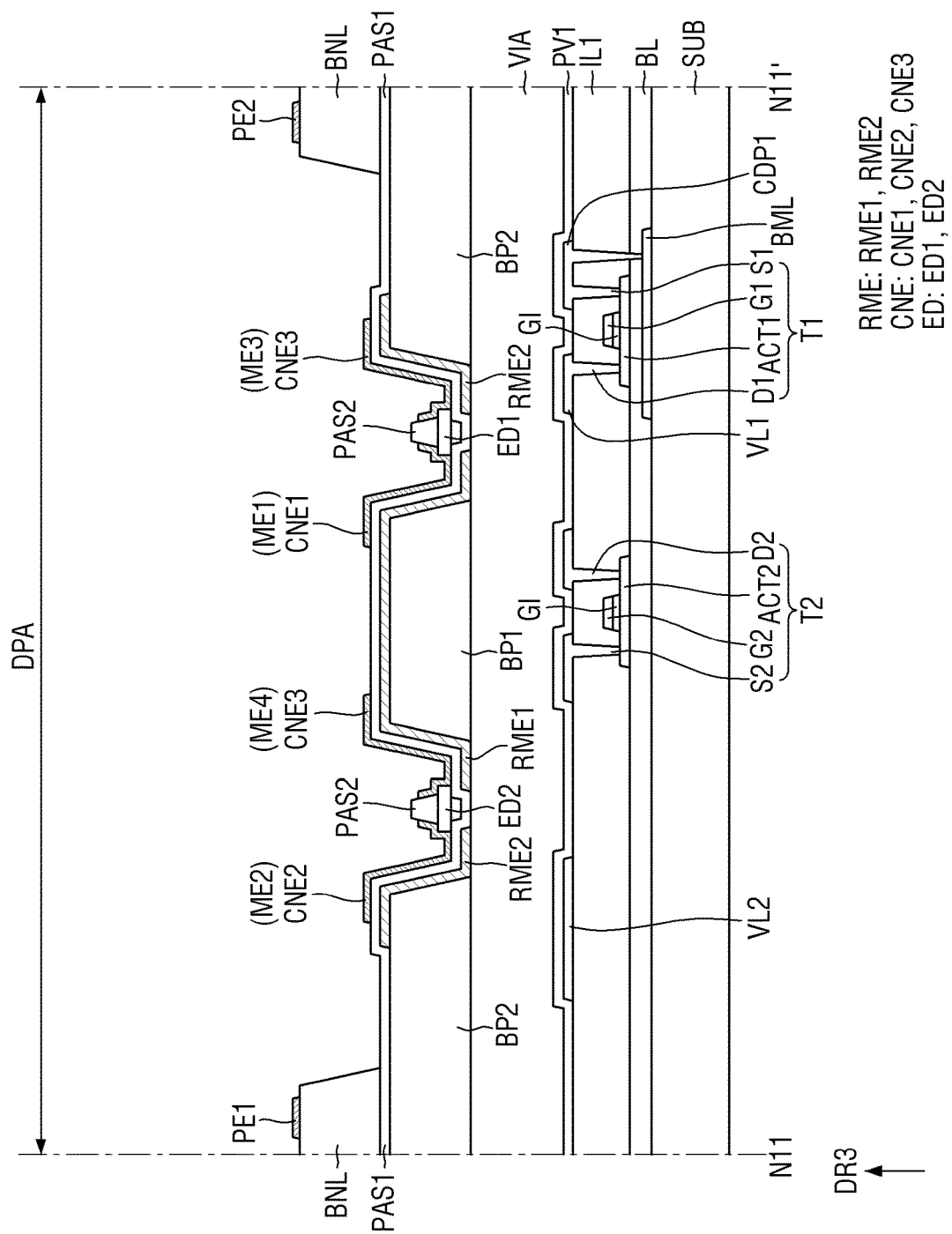
FIG. 27 is a schematic cross-sectional view taken along line N11-N11' in FIG. 26.

FIG. 26 is a schematic plan view illustrating connection electrodes disposed in a sub-pixel of a display device according to another embodiment. FIG. 27 is a schematic cross-sectional view taken along line N11-N11' in FIG. 26.

Referring to FIGS. 26 and 27, in a display device 10_5 according to an embodiment, the third insulating layer PAS3 may be omitted, and the connection electrodes CNE may be disposed on the same layer. An embodiment may be different from an embodiment of FIGS. 15 to 19 at least in that the arrangement structure of the connection electrodes CNE may be different.

The second insulating layer PAS2 may be disposed on the light emitting elements ED. The second insulating layer PAS2 may be disposed on the light emitting elements ED while extending in the first direction DR1. The second insulating layer PAS2 may be disposed to partially surround the outer surface of the light emitting element ED without covering both sides or both ends of the light emitting element ED. The second insulating layer PAS2 may form a linear or island-like pattern in each sub-pixel SPXn in plan view. The second insulating layer PAS2 may protect the light emitting elements ED while fixing the light emitting elements ED during the manufacturing process of the display device 10_5. The second insulating layer PAS2 may be disposed to fill the space between the light emitting element ED and the first insulating layer PAS1 thereunder.

The connection electrodes CNE (CNE1, CNE2, and CNE3) may be disposed on the electrodes RME and the light emitting element ED. The connection electrodes CNE may be disposed in an area on the first insulating layer PAS1 where the second insulating layer PAS2 may not be disposed, and may be partially in contact with the side surface of the second insulating layer PAS2. The first main portion ME1 of the first connection electrode CNE1 may be spaced apart from the third main portion ME3 of the third connection electrode CNE3 with the second insulating layer PAS2 interposed therebetween, and the second main portion ME2 of the second connection electrode CNE2 may be spaced apart from the fourth main portion ME4 of the third connection electrode CNE3 with the second insulating layer PAS2 interposed therebetween. The connection electrodes CNE may be disposed on substantially the same layer. In the display device 10_5 according to an embodiment, different connection electrodes CNE may be formed by the same process, which may be advantageous in a manufacturing process.

In concluding the detailed description, those skilled in the art will appreciate that many variations and modifications can be made to the embodiments without substantially departing from the principles of the disclosure. Therefore, the embodiments of the disclosure are used in a generic and descriptive sense only and not for purposes of limitation.

What is claimed is:

1. A display device comprising:
    a first electrode extending in a first direction;
    a second electrode spaced apart from the first electrode in a second direction;
    light emitting elements that are disposed on the first electrode and the second electrode;
    a first connection electrode electrically connected to a first end of the light emitting elements; and
    a second connection electrode electrically connected to a second end of the light emitting elements,
    wherein the first connection electrode includes:
        a first main portion disposed on the first electrode and in electrical contact with the light emitting elements;
        a first bypass portion partially spaced apart from the first main portion; and
        first connection portions electrically connecting the first main portion to the first bypass portion.

2. The display device of claim 1, further comprising:
    a bank layer extending in the first direction and the second direction to surround an emission area including the light emitting elements,
    wherein the first bypass portion is disposed on the bank layer.

3. The display device of claim 2, wherein
the second connection electrode includes:
    a second main portion disposed on the second electrode and in electrical contact with the light emitting elements;
    a second bypass portion partially spaced apart from the second main portion and disposed on the bank layer; and
    second connection portions electrically connecting the second main portion to the second bypass portion,
the first bypass portion does not overlap the first electrode, and
the second bypass portion does not overlap the second electrode.

4. The display device of claim 3, wherein
each of the first main portion and the second main portion extends in the first direction, and
each of the first bypass portion and the second bypass portion extends in the first direction.

5. The display device of claim 3, wherein
the first main portion and the second main portion are partially disposed on the bank layer, and
each of the first connection portion and the second connection portion is disposed on the bank layer.

6. The display device of claim 3, wherein each of the first bypass portion and the second bypass portion is disposed to partially overlap the emission area.

7. The display device of claim 6, wherein each of the first and second bypass portions and the first and second connection portions does not overlap the light emitting elements.

8. The display device of claim 3, further comprising:
a sub-region spaced apart from the emission area in the first direction, wherein
the first main portion and the second main portion extend to the sub-region,
the first connection electrode further comprises a first contact portion disposed in the sub-region and electrically connected to the first electrode, and
the second connection electrode further comprises a second contact portion disposed in the sub-region and electrically connected to the second electrode.

9. The display device of claim 8, wherein
the first main portion, the first connection portions, and the first bypass portion are electrically connected to the first contact portion, and
the second main portion, the second connection portions, and the second bypass portion are electrically connected to the second contact portion.

10. The display device of claim 3, wherein the first connection electrode further comprises a third connection portion spaced apart from the first connection portion and electrically connected to the first main portion and the first bypass portion.

11. The display device of claim 3, further comprising:
a first bank pattern extending in the first direction and overlapping the first electrode; and
a second bank pattern extending in the second direction and overlapping the second electrode, wherein
the first bank pattern overlaps the first main portion without overlapping the first bypass portion, and
the second bank pattern overlaps the second main portion without overlapping the second bypass portion.

12. The display device of claim 2, further comprising:
a third electrode spaced apart from the first electrode in the second direction with the second electrode interposed therebetween, wherein
the light emitting elements include:
a first light emitting element disposed on the second electrode and the third electrode; and
a second light emitting element disposed on the first electrode and the second electrode,
the first connection electrode is electrically connected to a second end of the second light emitting element, and
the second connection electrode is electrically connected to a first end of the first light emitting element.

13. The display device of claim 12, further comprising:
a third main portion disposed on the third electrode and in electrical contact with a second end of the first light emitting element;
a fourth main portion disposed to be spaced apart from the first main portion on the second electrode and in electrical contact with a first end of the second light emitting element;
a second bypass portion partially spaced apart from the third main portion;
a second connection portion electrically connected to the third main portion, the fourth main portion, and the second bypass portion; and
a third connection electrode comprising a third connection portion electrically connected to the third main portion and the second bypass portion.

14. The display device of claim 13, wherein each of the second connection portion, the third connection portion, and the second bypass portion is disposed on the bank layer.

15. The display device of claim 12, wherein
the first connection electrode further comprises a first contact portion in electrical contact with the first electrode, and
the second connection electrode further comprises a second contact portion in electrical contact with the second electrode.

16. A display device comprising:
electrodes extending in a first direction and spaced apart from each other in a second direction, the electrodes including a first electrode, a second electrode spaced apart from the first electrode in the second direction, a third electrode disposed between the first electrode and the second electrode, and a fourth electrode spaced apart from the third electrode in the second direction with the second electrode interposed therebetween;
light emitting elements disposed on the electrodes spaced apart from each other in the second direction;
a bank layer extending in the first and second directions and surrounding an emission area in which the light emitting elements are disposed; and
connection electrodes disposed on at least one of the electrodes and including a main portion in electrical contact with the light emitting elements, wherein
the connection electrodes include:
a first connection electrode including a first main portion disposed on the first electrode;
a second connection electrode including a second main portion disposed on the second electrode;
a third connection electrode including a third main portion disposed on the third electrode and facing the first main portion, and a fourth main portion disposed on the first electrode and spaced apart from the first main portion in the first direction;
a fourth connection electrode including a fifth main portion disposed on the fourth electrode and facing the second main portion, and a sixth main portion disposed on the second electrode and spaced apart from the second main portion in the first direction; and
a fifth connection electrode comprising a seventh main portion disposed on the second electrode and spaced apart from the second main portion in the first direction, and an eighth main portion disposed on the third electrode and spaced apart from the third main portion in the first direction, and
the first connection electrode includes a first bypass portion disposed on the bank layer to be partially spaced apart from the first main portion, a first connection portion disposed on the bank layer to electrically connect the first bypass portion to the first main portion, and
a second connection portion partially disposed in the emission area and electrically connecting the first bypass portion to the first main portion.

17. The display device of claim 16, wherein
the third connection electrode further comprises:
a third bypass portion disposed on the bank layer to be partially spaced apart from the fourth main portion;
the third main portion partially disposed in the emission area;
a third connection portion electrically connecting the fourth main portion to the third bypass portion, and
a fourth connection portion disposed on the bank layer and electrically connecting the fourth main portion to the third bypass portion, and the fourth connection electrode further comprises:
  a fourth bypass portion disposed on the bank layer to be partially spaced apart from the fifth main portion,
  the fifth main portion partially disposed in the emission area;
  a fifth connection portion electrically connecting the sixth main portion to the fourth bypass portion, and
  a sixth connection portion disposed on the bank layer and electrically connecting the fifth main portion to the fourth bypass portion.

18. The display device of claim 16, wherein the fifth connection electrode further comprises:
  a fifth bypass portion disposed on the bank layer to be partially spaced apart from the eighth main portion;
  the seventh main portion disposed on the bank layer;
  a seventh connection portion electrically connecting the eighth main portion to the fifth bypass portion; and
  an eighth connection portion partially disposed in the emission area and electrically connecting the eighth main portion to the fifth bypass portion.

19. The display device of claim 16, further comprising:
  a sub-region disposed in the first direction of the emission area, wherein
  the first connection electrode further comprises a first contact portion electrically connected to the first main portion and in electrical contact with the first electrode in the sub-region, and
  the second connection electrode further comprises a second contact portion electrically connected to the second main portion and in electrical contact with the second electrode in the sub-region.

20. The display device of claim 19, wherein the light emitting elements include:
  a first light emitting element disposed on the first electrode and the third electrode and having a first end in electrical contact with the first main portion and a second end in electrical contact with the third main portion;
  a second light emitting element disposed on the second electrode and the fourth electrode and having a first end in electrical contact with the fifth main portion and a second end in electrical contact with the second main portion;
  a third light emitting element disposed on the first electrode and the third electrode and having a first end in electrical contact with the fourth main portion and a second end in electrical contact with the seventh main portion; and
  a fourth light emitting element disposed on the second electrode and the fourth electrode and having a first end in electrical contact with the eighth main portion and a second end in electrical contact with the sixth main portion.

* * * * *